United States Patent
Alidio et al.

(10) Patent No.: US 7,839,216 B2
(45) Date of Patent: Nov. 23, 2010

(54) RF POWER AMPLIFIERS WITH LINEARIZATION

(75) Inventors: Raul Alidio, San Diego, CA (US);
Alexandre Dupuy, San Diego, CA (US);
Ajay Gummalla, San Diego, CA (US);
Woo Yong Lee, San Diego, CA (US);
Maha Achour, San Diego, CA (US)

(73) Assignee: Rayspan Corporation, San Diego, CA (US)

( * ) Notice: Subject to any disclaimer, the term of this patent is extended or adjusted under 35 U.S.C. 154(b) by 0 days.

(21) Appl. No.: 12/473,228

(22) Filed: May 27, 2009

(65) Prior Publication Data
US 2009/0295483 A1     Dec. 3, 2009

Related U.S. Application Data

(60) Provisional application No. 61/056,421, filed on May 27, 2008, provisional application No. 61/120,229, filed on Dec. 5, 2008.

(51) Int. Cl.
*H03F 3/68* (2006.01)
(52) U.S. Cl. .................. 330/295; 330/285; 330/286
(58) Field of Classification Search ............... 330/54, 330/277, 285, 295, 286, 296
See application file for complete search history.

(56) References Cited

U.S. PATENT DOCUMENTS

| | | | |
|---|---|---|---|
| 6,377,125 B1 | 4/2002 | Pavio et al. | |
| 7,023,278 B1 | 4/2006 | Vagher et al. | |
| 7,400,200 B2 * | 7/2008 | Fujii et al. | 330/295 |
| 7,579,913 B1 * | 8/2009 | Cheng et al. | 330/286 |
| 2009/0160575 A1 | 6/2009 | Dupuy et al. | |

FOREIGN PATENT DOCUMENTS

WO    2007136983 A2    11/2007

OTHER PUBLICATIONS

Thian, M., et al. "Design strategies for dual-band Class-E Power Amplifier Using Composite Right/Left-Handed Transmission Lines." Microwave and Optical Technology Letters, vol. 49, No. 11. Nov. 30, 2007. pp. 2784-2788.

Boumaiza, S., et al. "Adaptive Digital/RF Predistortion Using a Non-uniform LUT Indexing Function with Built-In Dependence on the Amplifier Nonlinearity." IEEE Transaction on Microwave Theory and Techniques, vol. 52, No. 12. Dec. 2004. pp. 2670-2677.

International Search Report and Written Opinion dated Jan. 13, 2010 for International Application No. PCT/US2009/045354 filed May 27, 2009 (12 pages).

Caloz and Itoh, *Electromagnetic Metamaterials: Transmission Line Theory and Microwave Applications*, John Wiley & Sons (2006).

Cripps, S., *RF Power Amplifiers for Wireless Communications*, Chapter 9, pp. 251-281, Artech House Publishers, 1999.

Itoh, T., "Invited Paper: Prospects for Metamaterials," Electronics Letters, 40(16):972-973, Aug. 2004.

Mata-Contreras, J., et al., "Assessment of a Composite Right/Left-Handed Transmission Line-Based Distributed Amplifier Implemented in Microstrip Technology," Proceedings of the 36th European Microwave Conference, pp. 1586-1589, Sep. 2006.

Mata-Contreras, J., et al., "Experimental Performance of a Meta-Distributed Amplifier," Proceedings of the 37th European Microwave Conference, pp. 743-746, Oct. 2007.

U.S. Appl. No. 12/474,270, filed May 28, 2009, entitled "Power Amplifier Architectures" by Dupuy et al.

U.S. Appl. No. 61/056,421, filed May 27, 2008, entitled "Variable Power Amplifier" by Alidio et al.

U.S. Appl. No. 61/120,229, filed Dec. 5, 2008, entitled "RF Power Amplifier with Peak Power Linearization" by Alidio et al.

\* cited by examiner

*Primary Examiner*—Khanh V Nguyen

(57) ABSTRACT

Designs and techniques associated with power amplifiers for amplifying RF signals to provide variable power amplification and improved linearity in various RF amplification circuits, including power amplifiers operated under the power back-off conditions.

37 Claims, 25 Drawing Sheets

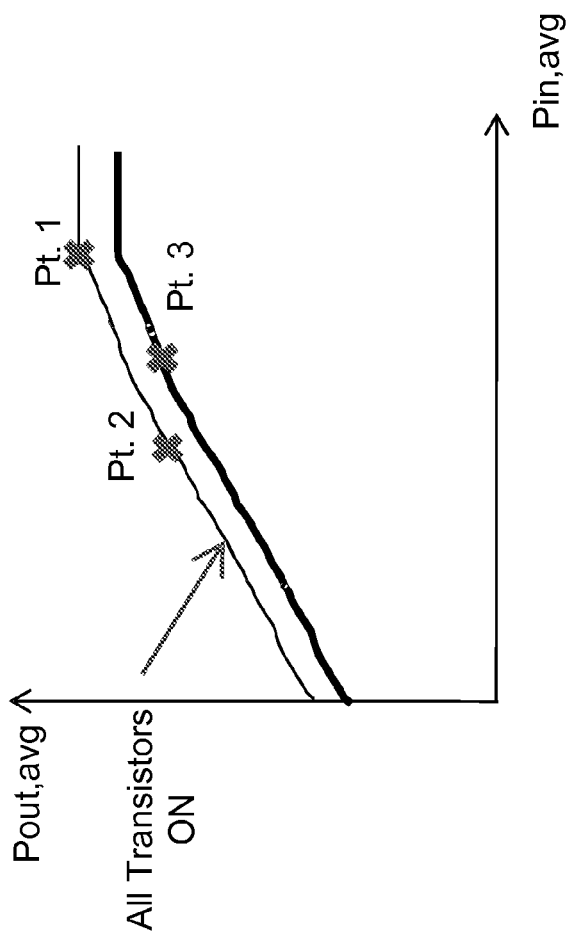
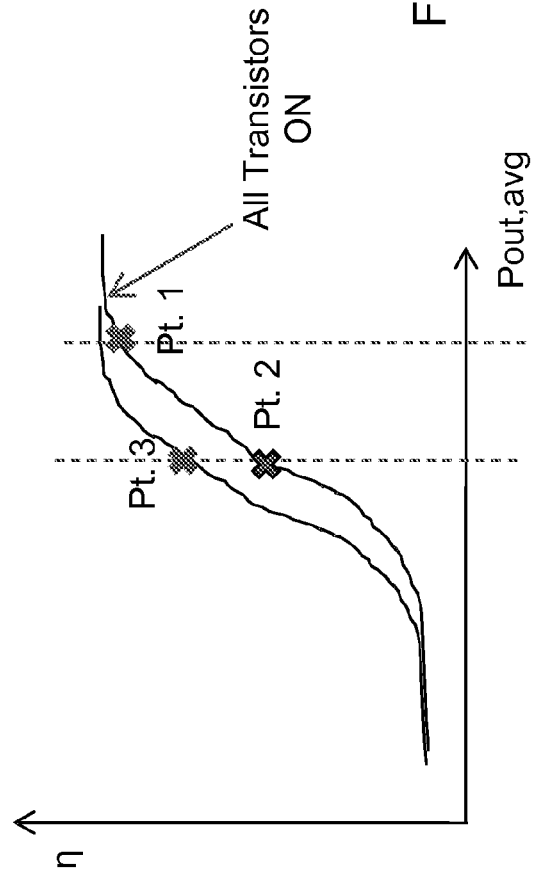
FIG. 7A
FIG. 7B

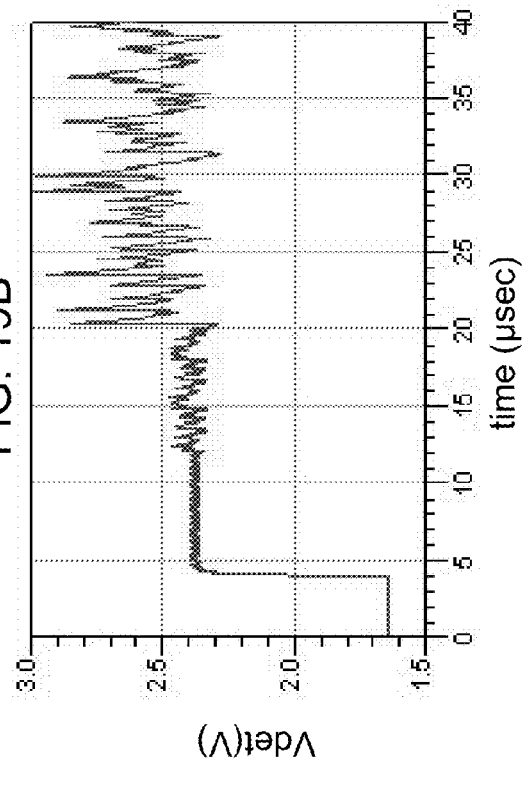
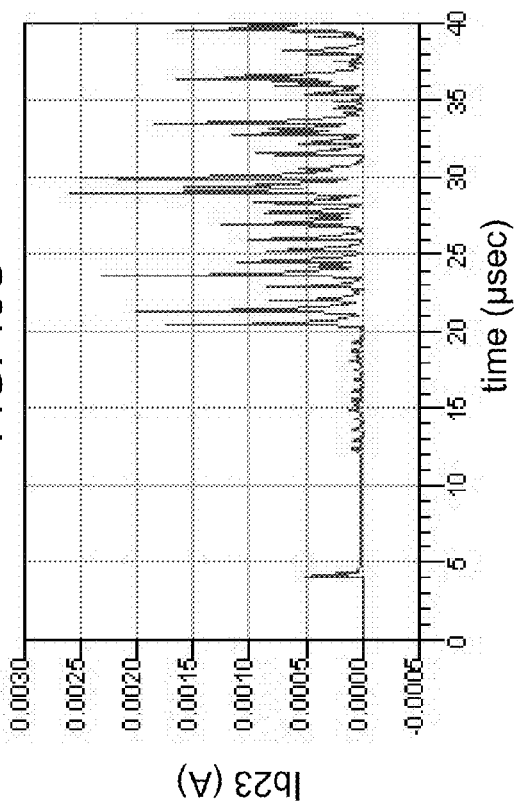
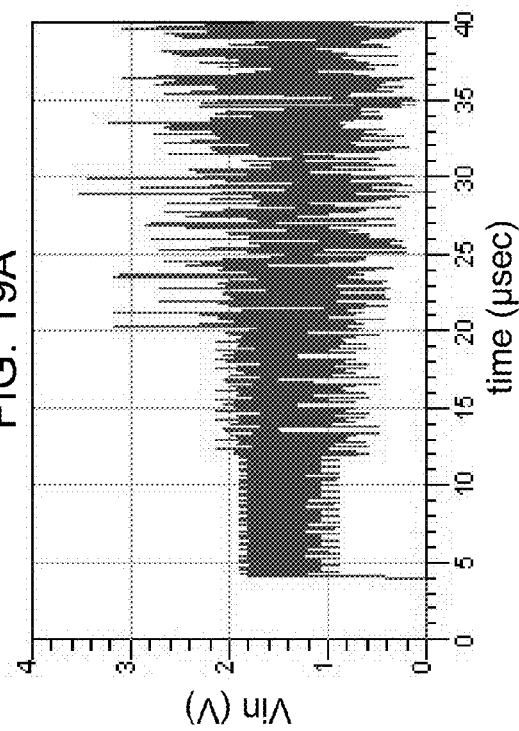

RF POWER AMPLIFIERS WITH LINEARIZATION

PRIORITY CLAIMS AND RELATED APPLICATIONS

This application claims the benefits of the U.S. Provisional Application Ser. No. 61/056,421 entitled "Variable Power Amplifier" and filed on May 27, 2008, and U.S. Provisional Application Ser. No. 61/120,229 entitled "RF Power Amplifier with Peak Power Linearization" and filed on Dec. 5, 2008. The entire disclosures of the above applications are incorporated herein by reference.

BACKGROUND

This document relates to radio frequency (RF) power amplifier designs and techniques.

Power amplifiers (PAs) are designed to amplify power of an RF signal and are widely used in various RF circuits and devices. For example, a transceiver system includes RF PAs, which generally occupy a very large chip/board area, require high DC power, and need to dissipate heat generated during operation. One function of an RF PA is to amplify the low input power of the RF signal to produce an RF output at higher power levels by converting DC power from a DC power supply into RF energy.

SUMMARY

This document discloses designs and techniques associated with power amplifiers for amplifying RF signals to provide variable power amplification and improved linearity in various RF amplification circuits, including power amplifiers operated under the power back-off conditions.

In one aspect, a variable power amplifier device is provided to include transmission lines that transmit RF signals, banks of segmented transistors that amplify RF signals, and a mechanism to vary the power level and efficiency by switching on or off one or more banks of the segmented transistors.

In another aspect, a variable power amplifier device is provided to include transmission lines that transmit RF signals, banks of segmented transistors that amplify RF signals, and a mechanism to vary the power level and efficiency by individually biasing the banks of the segmented transistors.

In another aspect, a power amplifier device is provided to include an input port that receives an RF signal to be amplified in power, an output port that outputs the RF signal that is amplified in power and cells electrically coupled to amplify the received RF signal. Each of the cells having a first end coupled to the input port and a second end coupled to the output port and comprising one or more banks of transistors. A bias circuit is included in this device to provide a bias signal to turn on at least one bank of transistors in the plurality of cells and maintain a bias at the at least one bank during amplification of the RF signal. An RF signal detector circuit is provided to detect the RF signal to produce a detected voltage. This device also includes a bias control circuit that receives the detected voltage, produces control signals based on the detected voltage, and supplies, respectively, the control signals to the banks of transistors other than the at least one bank of transistors that is biased on, to control an output current to increase with an increase in the control signals. In this device, the cells, the bias circuit, the RF signal detector circuit and the bias control circuit are configured to increase an output power associated with the output current to increase a linear region and efficiency at a power back-off condition.

In another aspect, a power amplifier device is provided to include an input port that receives an RF signal to be amplified in power, an output port to output the RF signal that is amplified in power, a cell that includes a first end coupled to the input port, a second end coupled to the output port and transistors that are segmented into a first bank and a second bank to amplify power of the RF signal. This device includes a variable output matching network (OMN) coupled between the cell and the output port to direct the RF signal that is amplified in power to the output port, a bias circuit that provides a bias signal to turn on the first bank and keeps the first bank biased on during amplification of the RF signal, an RF signal detector circuit that detects the RF signal to produce a detected voltage, and a bias control circuit that receives the detected voltage, produces first and second control signals based on the detected voltage, and directs the first control signal to the second bank to control an output current to increase with an increase in the first control signal and the second control signal to the variable OMN. In this device, the cell, the RF signal detector circuit, the bias circuit, the OMN and the bias control circuit are configured to increase an output power with an increase in the output current to expand a linear region and increase efficiency at a power back-off.

In another aspect, a power amplifier device is provided for receiving an RF signal associated with an input power at an input port, amplifying the RF signal to an output power with a higher power level, and presenting the RF signal that is amplified and associated with the output power at an output port. This device includes cells, each of which has a first end coupled to the input port and a second end coupled to the output port and comprises at least one bank of transistors; transmission lines connecting the cells, the output port, and the input port; and a control circuit coupled to the cells to provide control signals respectively for the banks of transistors to vary the output power by individually switching on and off the banks of transistors.

In another aspect, a method is provided for amplifying an RF signal associated with an input power to an output power with a higher power level to have the RF signal that is amplified and associated with the output power by using a power amplifier device that includes cells, each of which has a first end coupled to an input port and a second end coupled to an output port and comprises one or more banks of transistors. This method includes applying a bias signal to turn on at least one bank of transistors in the plurality of cells and keep the at least one bank biased on during an operation; detecting the RF signal; converting the RF signal that is detected in the detecting step to a detected voltage; producing control signals based on the detected voltage; applying the control signals respectively to the banks of transistors other than the at least one bank of transistors that is biased on, to control an output current to increase with an increase in the control signals, to expand a linear region of the device and to increase efficiency of the device at a power back-off.

In another aspect, a method is provided for amplifying an RF signal associated with an input power to an output power with a higher power level to have the RF signal that is amplified and associated with the output power by using a power amplifier comprising a first cell and a second cell. Each of the first and second cells has a first end coupled to an input port and a second end coupled to an output port. The first cell includes transistors segmented into a first bank of transistors and a second bank of transistors and the second cell includes a third bank of transistors. This method includes applying a bias signal to turn on the first bank and keep the first bank biased on during an operation; detecting the RF signal; converting the detected RF signal to a DC voltage; producing a control signal based on the DC voltage; applying the control signal to the second bank and the third bank, to control an output current to increase with an increase in the control signal to expand a linear region and increase efficiency at a power back-off.

In yet another aspect, a power amplifier device is disclosed that provides a variable amplification to an RF signal based on a Composite Right and Left Handed Metamaterial structure. This device includes an input port to receive an input RF signal to be amplified, an output port to output an output RF signal that is amplified by amplifying the input RF signal, banks of one or more transistors that amplify RF signals and are coupled between the input port and the output port, transmission lines coupled to connect the banks of one or more transistors, the input port and the output port, and a control mechanism coupled to the banks of one or more transistors to selectively switch on or off one or more banks of one or more transistors and to control the one or more banks of one or more transistors that are switched on to vary a power level of the output RF signal and efficiency of the device. In this device, at least one of the transmission lines includes a Composite Right and Left Handed Metamaterial (CRLH MTM) structure.

These and other aspects, and their implementations and variations are described in detail in the attached drawings, the detailed description and the claims.

BRIEF DESCRIPTION OF THE DRAWINGS

FIGS. 7A and 7B schematically show average output power (Pout,avg) as a function of average input power (Pin,avg) and efficiency ($\eta$) as a function of Pout,avg, respectively.

FIG. 19A shows an example of an OFDM signal with Pin,avg=15 dBm, illustrating the non-constant envelope in input voltage Vin.

FIG. 19B shows the time variation of Vdet, which is fed into the bias control circuit, where Vdet is converted to bias control current Ib23.

FIG. 19C shows the time variation of Ib23, which is the base current for the banks Q2 and Q3.

DETAILED DESCRIPTION

Figure 1:
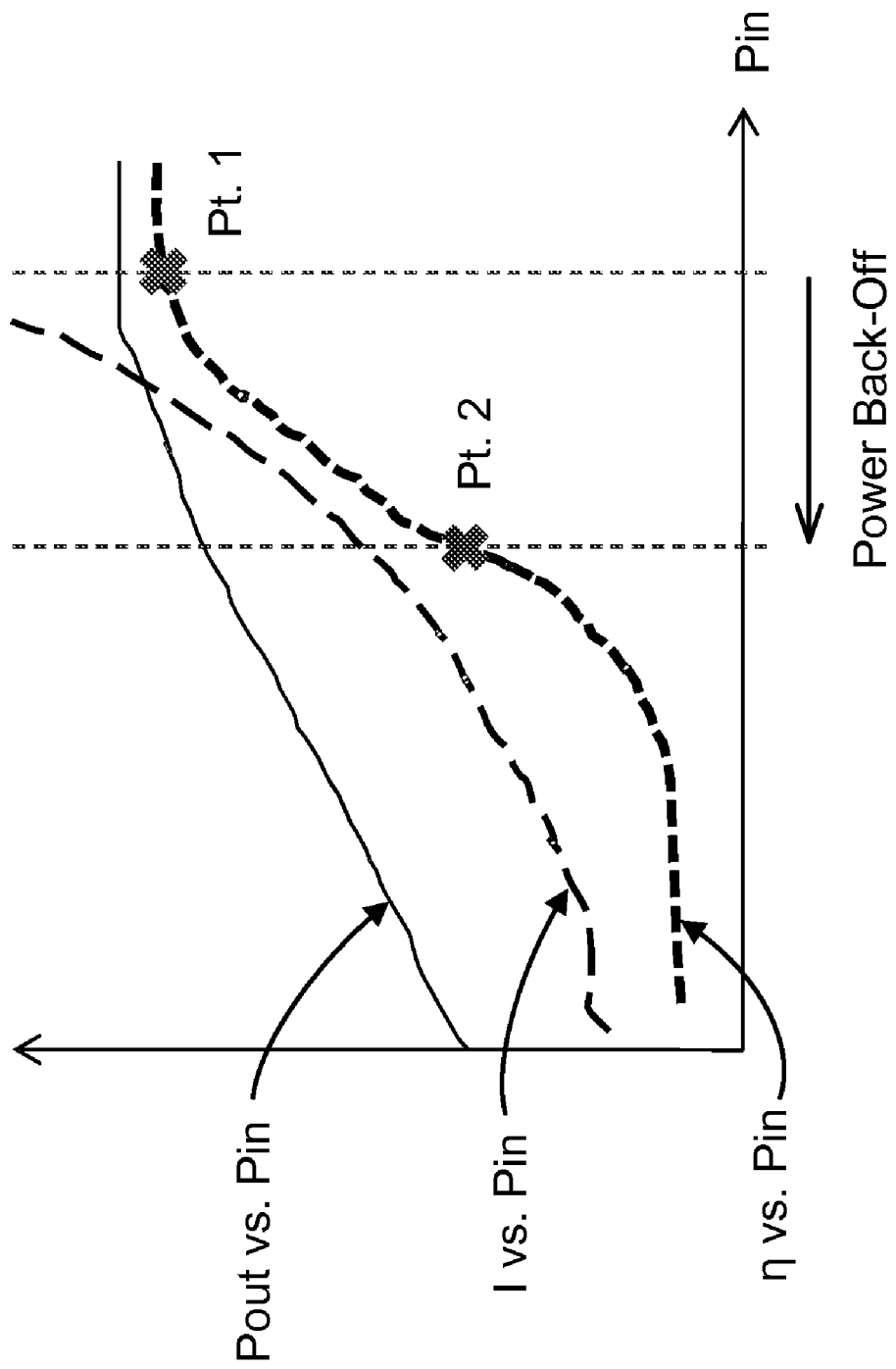
FIG. 1 schematically shows an example of a power back-off situation in an power amplifier, where the output power (Pout), the electric current (I) and the efficiency ($\eta$) are plotted as a function of the input power (Pin).

Various power amplifier architectures are available for designing RF devices and systems. Some implementations for the techniques, devices and systems described in this document can incorporate features in various power amplifier architectures.

For example, linear PAs biased Class AB are widely used in RF applications while other PA architectures are also used such as certain PA architectures used in Global System for Mobile communications (GSM), General Packet Radio Service (GPRS) communication systems and Enhanced Data rates for GSM Evolution (EDGE) applications, some of which use the Gaussian Minimum Shift Keying (GMSK)

modulation. In general, Class A PA can be used when the DC bias current is dominant or significantly larger than the RF currents. Class AB Pas can be used when the RF current becomes significant and begins to affect the PA's bias point. Class AB amplifiers can achieve higher efficiency than Class A amplifiers in many implementations.

Generally, PAs are designed to achieve their maximum efficiencies at their respective maximum power levels. Various wireless standards targeting high communication throughput utilize complex modulation schemes by manipulating both amplitude and phase components to generate an RF signal. Such techniques may impose stringent linearity requirements on the PAs in the system. At the same time, the PAs may be required to operate at adequate levels of efficiencies to minimize battery power consumption and to reduce heat dissipation. Thus, PA designs that achieve good efficiency and linearity are desired for wireless communication systems. In addition to operating in the linear region while maintaining adequate efficiency, modern wireless applications may require devices to support multiple frequency bands. In some implementations, PAs are designed to operate in their respective single bands and are packaged into a single module to provide multiple band operations.

Some modulation schemes used in wireless systems, such as Quadrature Amplitude Modulation (QAM) with Orthogonal Frequency Divisional Multiple Access (OFDMA) or Code Division Multiple Access (CDMA), create RF signals that have a high Peak to Average Power Ratio (PAPR) in the range of 7-15 dB, for example. To avoid this, the PA is set to operate so as to output the power that is lower than its peak output power until the linearity requirements are just met. This operation is referred to as "power back-off" and can significantly reduce the efficiency of the PA when the PA is designed to achieve its maximum efficiency at or near its maximum power level. Typical Power Added Efficiency (PAE) values for OFDM signals (802.11a/g, WiMax) are 15% to 20% peak PAE@5% RMS EVM or <10% peak PAE@2% RMS EVM, where EVM stands for Error Vector Magnitude. In an RF power amplifier, PAE is defined as the ratio of the difference between the output and input power to the DC power consumed, whereas efficiency is defined as the ratio of the output power to the DC power consumed.

FIG. 1 schematically shows an example of a power back-off situation of a PA, where the output power (Pout), the electric current (I) and the efficiency (η) are plotted as a function of the input power (Pin). In this example, Pout and Pin are in the average sense when non-constant modulated signals are used. As shown in FIG. 1, linearity and good efficiency do not occur simultaneously. The PA is operated so that the power of the PA is backed off from its maximum level to meet linearity requirements. Under this power back-off condition, the efficiency and current decrease as the operating point of the PA is changed from its maximum power level at Pt. 1 to the power back-off point at Pt. 2 following the path Pt. 1 to Pt. 2.

To increase the output power of a PA, either the voltage swing or the current swing of the PA needs to be increased. Conventionally, the size of the device periphery is increased to allow a large current swing. An increase in the device size can increase its maximum power, but also decreases its optimum load impedance, which is difficult to match. Furthermore, such devices are not amenable to CMOS fabrication and may require special device technologies such as GaAs- or SiGe-based fabrication technologies.

Figure 2:
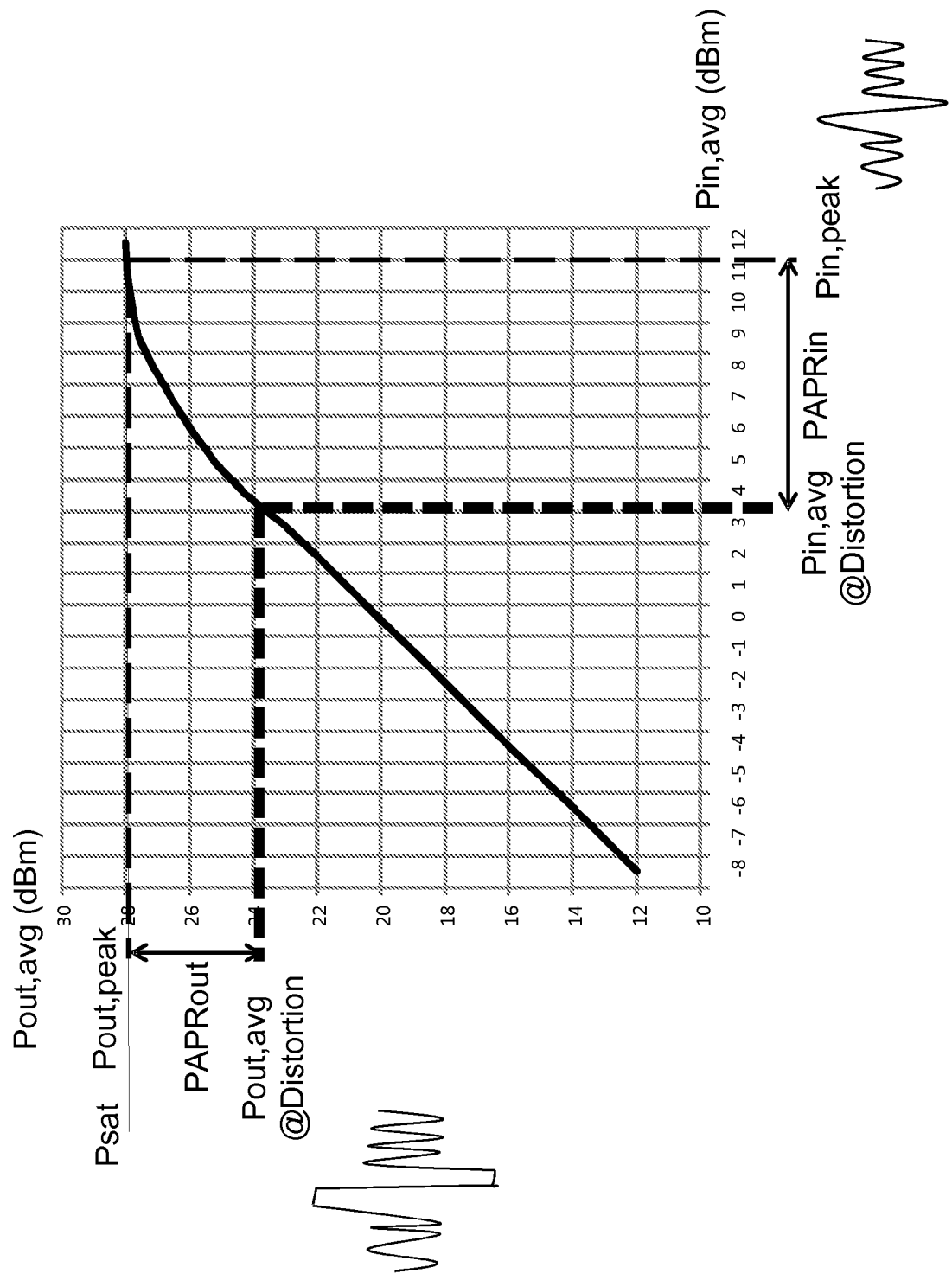
FIG. 2 shows an example of the signal distortion observed in the output PAPR (PAPRout) based on the Pout,avg-versus-Pin,avg plot for the case of no power back-off.

FIG. 2 shows an example of the signal distortion observed in the output PAPR (PAPRout) based on the Pout,avg-versus-Pin,avg plot for the case of no power back-off. Saturation power (Psat) refers to the maximum rated power that the device can reach, and peak output power (Pout,peak) refers to the peak output power level of a modulated RF signal. Pout,avg and Pin,avg refer to the average output power and average input power, respectively. In this example, input PAPR (PAPRin) ranges from 3.5 dBm to 11.5 dBm, but the range of the PAPRout values is limited to 24-28 dBm due to the non-linearity. Furthermore, as the Pout,peak level approaches and surpasses the Psat level (28 dBm in this example), the output RF signal undergoes a distortion at high PAPRout points, as illustrated by the schematic waveform in FIG. 2. Thus, the EVM requirements are difficult to meet at this power level.

Figure 3:
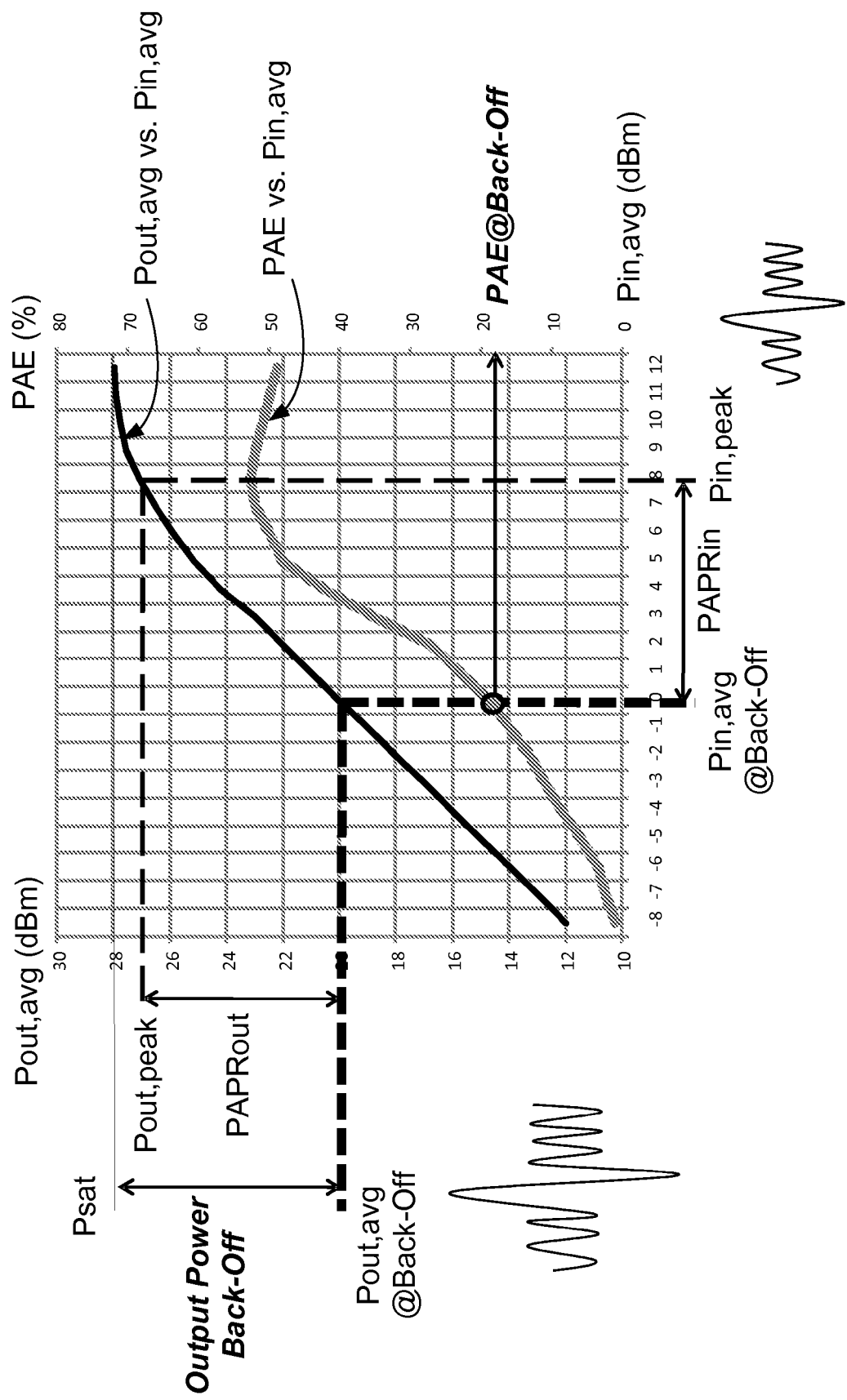
FIG. 3 shows an example of a power back-off situation of a power amplifier in which the PAPRin is reduced from the range between 3.5 dBm and 11.5 dBm as shown in FIG. 2 to the range between 0 dBm and 8 dbm so as to recover the linearity.

FIG. 3 shows an example of the power back-off situation of a PA in which the PAPRin is reduced from the range between 3.5 dBm and 11.5 dBm as shown in FIG. 2 to the range between 0 dBm and 8 dbm so as to recover the linearity. The range of PAPRout values is now widened to 20-27 dBm in FIG. 3 from 24-28 dBm in FIG. 2 due to the recovered linearity. Furthermore, the signal waveform is restored because the Pout,peak level is now positioned below the Psat level. Thus, the EVM requirements are met under the power back-off condition, but the overall PAE is significantly reduced, as represented by PAE@back-off in the figure.

The 4G ($4^{th}$ Generation) wireless communication technology like WiMax (Worldwide Interoperability for Microwave Access) and LTE (Long Term Evolution) may require relatively high power consumption and thus can reduce the handset battery lifetime in comparison to the 3G ($3^{rd}$ Generation) technology. One of the reasons for the relatively high power consumption in the 4G technology is the increased power consumption in the RF power amplifier and RF transmitter chain in the 4G chips. This increased power consumption may be caused by the higher PAPR of the non-constant envelope modulation signals due to higher order modulations and OFDM.

The power amplifier architectures described in this document can be implemented to incorporate switchable transistor banks and individual bias control of the transistor banks. Such implementations can be used to achieve high linearity and efficiency. Such implementations can provide improved battery life performance in wireless terminal applications in wireless communication systems. The described power amplifier architectures can be used in Base Station, Access Point, and Femto-cell technologies to reduce power consumption.

In some implementations, the power amplifier architectures use a distributed power amplifier type topology with cells that are coupled in parallel, with one end of each cell connected to an input line and the other end connected to an output line to amplify the RF input power to higher levels and present the amplified RF power signal at the output port. Each of the cells contains at least one bank of segmented transistors. The power level can be varied by switching on and off one or more banks of segmented transistors. Such a PA is a Variable Power Amplifier (VPA). The banks of segmented transistors can be configured to be electrically biased individually. The bias point and switching flexibility in the VPA allows optimization of the linearity and efficiency by providing the capability of adjusting the output power level. Notably, the banks of segmented transistors can be controlled to vary the output power level to allow recovery of the efficiency under a power-back off condition.

The present PA architectures can be implemented based on different circuit structures. The propagation of electromagnetic waves in most materials obeys the right handed rule for the (E,H,β) vector fields, where E is the electrical field, H is the magnetic field, and β is the wave vector. The phase velocity direction is the same as the direction of the signal energy propagation (group velocity) and the refractive index is a positive number. Such materials are "right handed" (RH). Most natural materials are RH materials. Artificial materials can also be RH materials. A metamaterial (MTM) has an artificial structure. When designed with a structural average unit cell size p much smaller than the wavelength of the electromagnetic energy guided by the metamaterial, the metamaterial can behave like a homogeneous medium to the guided electromagnetic energy. Unlike RH materials, a metamaterial can exhibit a negative refractive index with permittivity $\epsilon$ and permeability $\mu$ being simultaneously negative, and the phase velocity direction is opposite to the direction of the signal energy propagation where the relative directions of the $(E,H,\beta)$ vector fields follow the left handed rule. Metamaterials that support only a negative index of refraction with permittivity $\epsilon$ and permeability $\mu$ being simultaneously negative are pure "left handed" (LH) metamaterials. Many metamaterials are mixtures of LH metamaterials and RH materials and thus are Composite Right and Left Handed (CRLH) metamaterials. A CRLH metamaterial can behave like a LH metamaterial at low frequencies and a RH material at high frequencies. Designs and properties of various CRLH metamaterials are described in, for example, Caloz and Itoh, "Electromagnetic Metamaterials: Transmission Line Theory and Microwave Applications," John Wiley & Sons (2006). CRLH metamaterials and their applications in antennas are described by Tatsuo Itoh in "Invited paper: Prospects for Metamaterials," Electronics Letters, Vol. 40, No. 16 (August 2004).

CRLH metamaterials can be structured and engineered to exhibit electromagnetic properties that are tailored for specific applications and can be used in applications where it may be difficult, impractical or infeasible to use other materials. In addition, CRLH metamaterials may be used to develop new applications and to construct new devices that may not be possible with RH materials. Examples of MTM antenna, transmission lines, RF power dividers and combiners can be found, e.g., in U.S. patent application Ser. No. 11/741,674 entitled "Antennas, Devices and Systems Based on Metamaterial Structures" and filed on Apr. 27, 2007 (U.S. Patent Publication No. US-2008-0258981-A1), Ser. No. 11/844,982 entitled "Antennas Based on Metamaterial Structures" and filed on Aug. 24, 2007 (U.S. Patent Publication No. US-2008-0048917-A1), and Ser. No. 11/963,710 entitled "Power Combiners and Dividers Based on Composite Right and Left Handed Metamaterial Structures" and filed on Dec. 21, 2007 (U.S. Patent Publication No. US 2010-0109803 A2), which are incorporated by reference as part of the disclosure of this document. The circuit structures for the present PA architectures can be based on RH material structures or CRLH MTM structures. As an example, the transmission lines used in the present PA architectures can be implemented by CRLH Metamaterial (MTM) transmission lines or circuit components to achieve multi-band or wide-band operations in compact form factors while complying with impedance and phase matching conditions. Consider a simple example of a 1-dimensional structure of CRLH MTM elements which can include MTM unit cells characterized by the cell shunt inductance (LL), the cell shunt capacitance (CR), the cell series inductance (LR) and the cell series capacitance (CL). These parameters and the number of MTM unit cells determine the resonant frequencies, the corresponding bandwidth, input and output impedance matching and the circuit structure and size. The LH properties of MTM structures allow the dimensions of MTM structures to be smaller than equivalent circuits made of RH materials, e.g., a fraction of $\lambda/2$, where $\lambda$ is the propagation wavelength of an RF signal in the free-space. An CRLH transmission line can be designed to have an electrical length that corresponds to a phase of zero degree, 180 degrees or a multiple of 180 degrees, 90 degrees or a multiple of 90 degrees at an operating signal frequency. An CRLH structure can also be designed to support two or more frequency bands or broad band operations in a PA system. PA systems can incorporate CRLH MTM structures to provide multi-band operation, high efficiency, variable output power, and compact form factor while complying with impedance and phase matching conditions.

Figure 4:
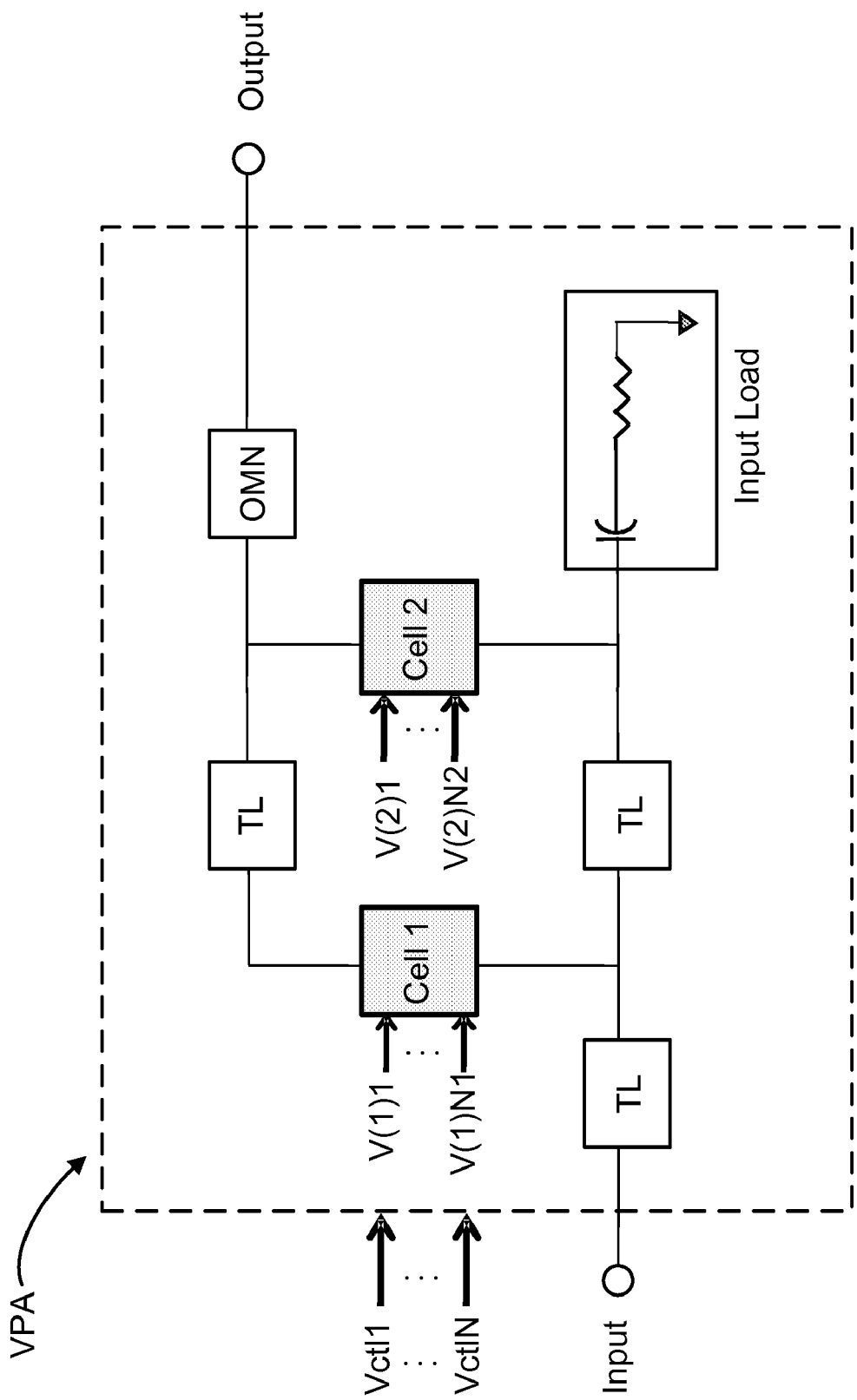
FIG. 4 shows a block diagram of an exemplary Variable Power Amplifier (VPA) connected to the input and output ports.

FIG. 4 shows a block diagram of an exemplary Variable Power Amplifier (VPA) connected to the input and output ports. The VPA is a type of distributed power amplifier including transmission lines (TLs) that can be made of either non-MTM circuit components or CRLH MTM components, an input load to absorb input reflections and an output matching network (OMN). An output load may optionally be included. The exemplary VPA in FIG. 4 includes two cells, cell 1 and cell 2, for amplifying the input signal. Each cell has one or more banks or groups of segmented transistors. A control circuit, which is outside the VPA in this example, supplies control voltages Vctl1, Vctl2 . . . and VctlN to control the individual banks in the cells by selectively switching on or off the individual banks. The number of amplifying cells as well as the number of banks of segmented transistors in a cell can be selected as part of the design of the VPA depending on the specific requirements of an application. In the example shown in FIG. 4, the cell 1 contains N1 banks, which are individually controlled by V(1)1-V(1)N1 corresponding to a subset of Vctl1-VctlN, where N1≦N. Similarly, the cell 2 contains N2 banks, which are individually controlled by V(2)1-V(2)N2 corresponding to another subset of Vctl1-VctlN, where N2≦N. Two or more of V(1)1-V(1)N1 and V(2)1-V(2)N2 can be configured to be the same so as to commonly control the corresponding banks.

In operation of the VPA in FIG. 4, the input signal is directed into the input port of the VPA. After transmitting through a TL, the input signal is split into a first signal to the cell 1 and a second signal to the cell 2 after transmitting through another TL. The amplified outputs from the cell 1 and cell 2 are combined in a TL and directed to the output matching network (OMN) which produces the amplified output signal at the output port of the VPA. The input load can be coupled at the illustrated location to absorb reflections from the cell 2 or cell 1.

Figure 5:
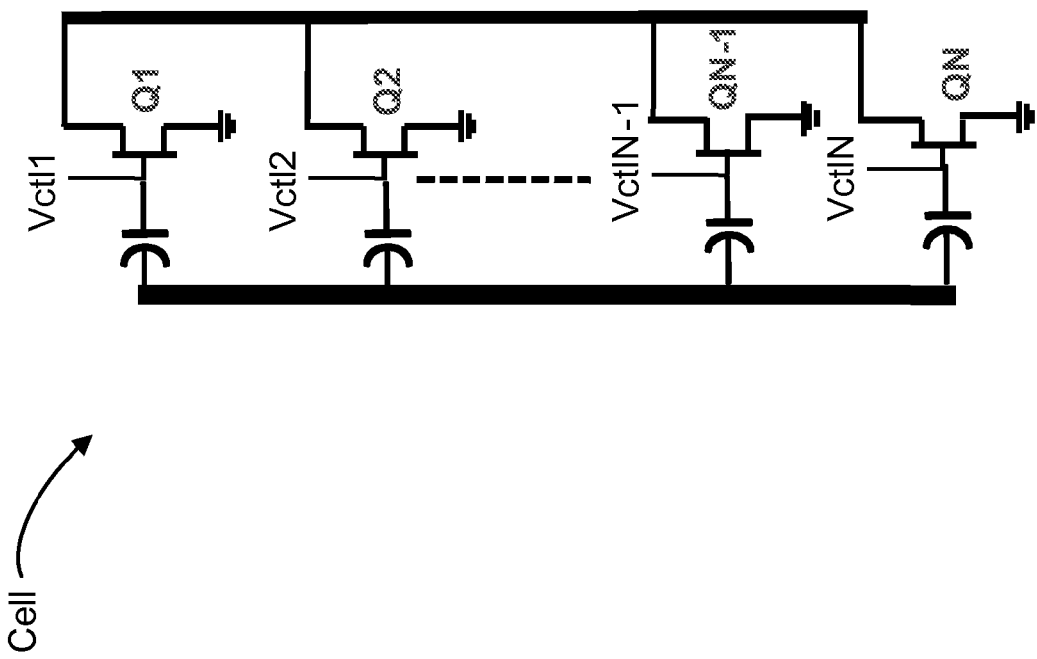
FIG. 5 shows an example of a cell, in which the transistors are segmented into banks, Q1, Q2, . . . , QN−1 and QN.

FIG. 5 shows an example of a cell, in which the transistors are segmented into banks of transistors, Q1, Q2, QN−1 and QN, where each bank Q represents a group of segmented transistors. For example, the $M^{th}$ bank, QM, has the $M^{th}$ group of segmented transistors, q1, q2, . . . , and qK, where 1≦M≦N and 1≦K. The banks, Q1, Q2, . . . , QN−1 and QN, are configured to be individually switched on and off or biased according to the respective control voltages, Vctl1, Vctl2, . . . , VctlN−1 and VctlN. The source, gate and drain terminals of the transistors in each bank are connected to their respective common source, gate and drain connections, and are simultaneously controlled by the control voltage specific to the bank. More specifically, within each bank, the source terminals of the transistors are connected to one another to a common source connection, the gate terminals of the transistors are connected to one another to a common gate connection, and the drain terminals of the transistors are connected to one another to a common drain connection. A control voltage is applied to control all transistors of a particular bank. In the example in FIG. 5, different transistors in a bank QM are connected as described above and, in addition, the common drain connections of the different banks are connected together and the common source connections of the different banks are connected to the ground. The common gate connections of the different banks, however, are connected to receive their respective control voltages VctlM (M=1, 2, . . . , and N). A capacitor is coupled to the common gate connection of each bank for isolation purposes in this example.

In implementations, different cells may have the same or different number of banks of one or more transistors. For example, a cell may have only one bank of transistors or a single transistor controlled by a control voltage while another cell may have two or more banks of one or more transistors. The number of cells in a VPA, the number of banks in a cell, N, and the number of segmented transistors in each bank, K, can be predetermined based on target applications and desired power levels. Specifically, the size of the banks of the VPA depends on the maximum RF output power (all banks on) as well the minimum RF output power (one bank on) required for the application. In general, the amplification of the VPA increases as the number of the banks that are switched on increases. Thus, the segmentation of the transistors into different individually controlled banks allows a variable amplification to be achieved. For example, the VPA may be operated to have some banks turned on while other banks of transistors are turned off at an initial operation and then turn on some additional transistors to increase the amplification to set the output signal at predetermined power levels.

The transistors in FIG. 5 can be implemented by using field effect transistors (FETs), bipolar junction transistors (BJTs) and other types of transistors. In an example of using BJTs, the gate, drain and source terminals are replaced with the base, collector and emitter terminals, and base currents control the on/off and bias of the individual banks of segmented BJTs. Various semiconductor fabrication technologies can be utilized to implement the transistors, including but not limited to, GaAs pHEMT, GaAs and SiGe HBT, and Si CMOS.

Referring back to FIG. 4, one example of the VPA may include a total of 20 transistors: 10 in cell 1 and 10 in cell 2. The 10 transistors in cell 1 form a bank Q1, and the 10 transistors in cell 2 can be segmented into two banks, Q2 and Q3, each having 5 transistors. Depending on the target power and efficiency levels, the control circuit can be configured to provide two control voltages for the three banks, for example, Vctl1 for Q1 and Q2 and Vctl2 for Q3.

Figure 6:
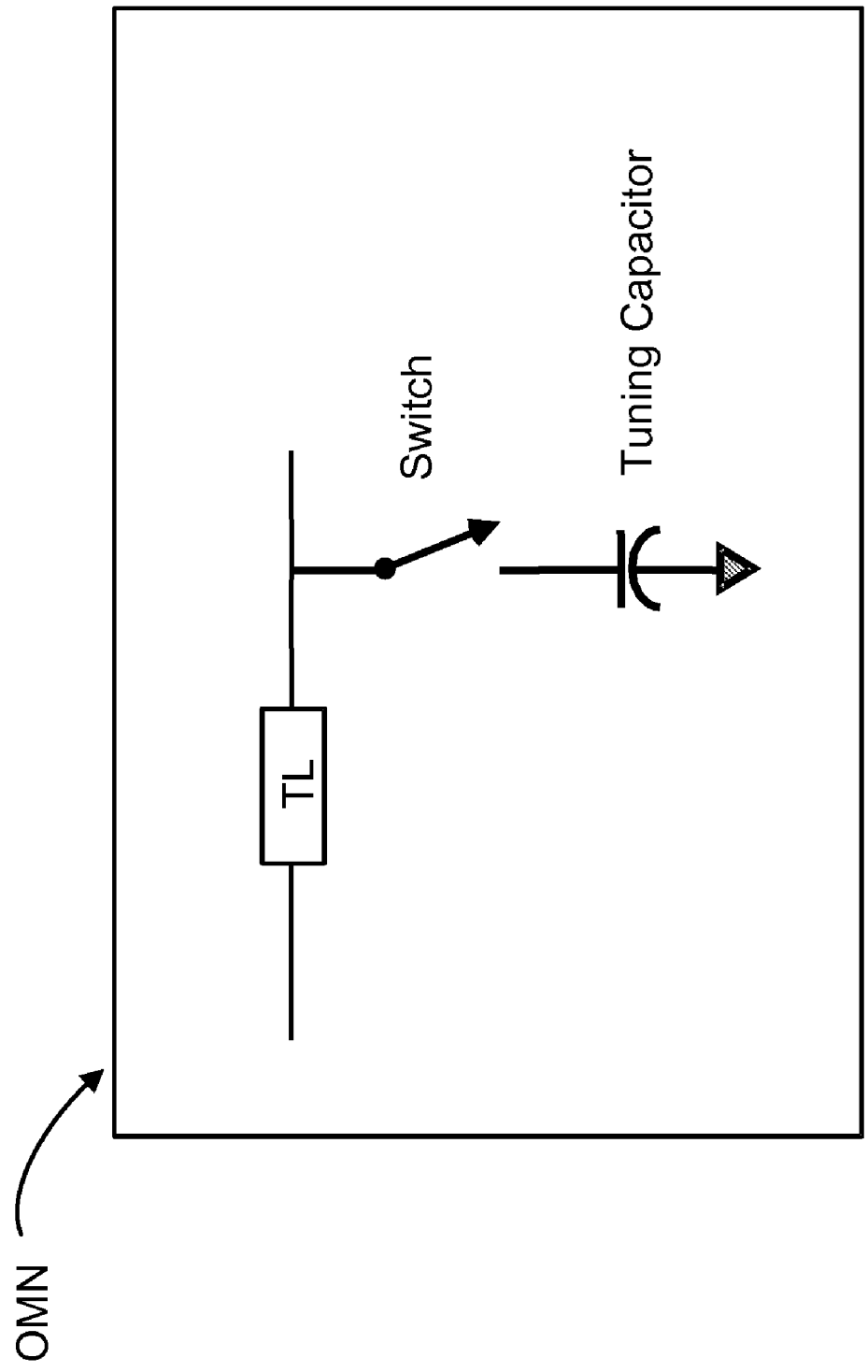
FIG. 6 shows an example of the output matching network (OMN) circuit.

FIG. 6 shows an example of the output matching network (OMN) circuit for the VPA in FIG. 4. This is a switchable OMN including a tuning capacitor and a switch connected in series. The switch provides the option of turning off the connection to isolate the tuning capacitor from the OMN circuit. In a normal operation, the switch is closed so that the tuning capacitor functions as part of the OMN. For simple and cost-effective versions, the switch can be omitted.

FIGS. 7A and 7B schematically show average output power (Pout,avg) as a function of average input power (Pin, avg) and efficiency (η) as a function of Pout,avg, respectively. The efficiency recovery at lower power levels in the VPA can be achieved by turning off one or more banks of segmented transistors. Pt. 1 represents the point where the maximum linear power and efficiency are achieved with all the transistors on, but the non-linearity starts to become prominent. To meet linearity requirements, the average output power (Pout, avg) is backed off to Pt. 2, where the efficiency is significantly reduced as shown in FIG. 7B. The higher efficiency at Pt. 3 can be obtained by switching off one or more banks of segmented transistors, while keeping the output power level substantially the same between Pt. 2 and Pt. 3.

Another scheme of improving the efficiency under the power back-off condition includes individual biasing of the banks of segmented transistors in the VPA. An exemplary case of four banks, Q1-Q4, is considered below with reference to FIGS. 7A and 7B, again. Pt. 1 represents the point where the near saturated output power and maximum efficiency are achieved by biasing all transistors at Class AB bias point, for example. As the Pout is backed off to Pt. 2, the efficiency is reduced. By keeping Q1 and Q2 to Class AB bias, and driving Q3 and Q4 towards cutoff bias, Pt. 3 can be reached where the output power level is substantially the same as that of Pt. 2 while achieving higher efficiency.

Figure 8:
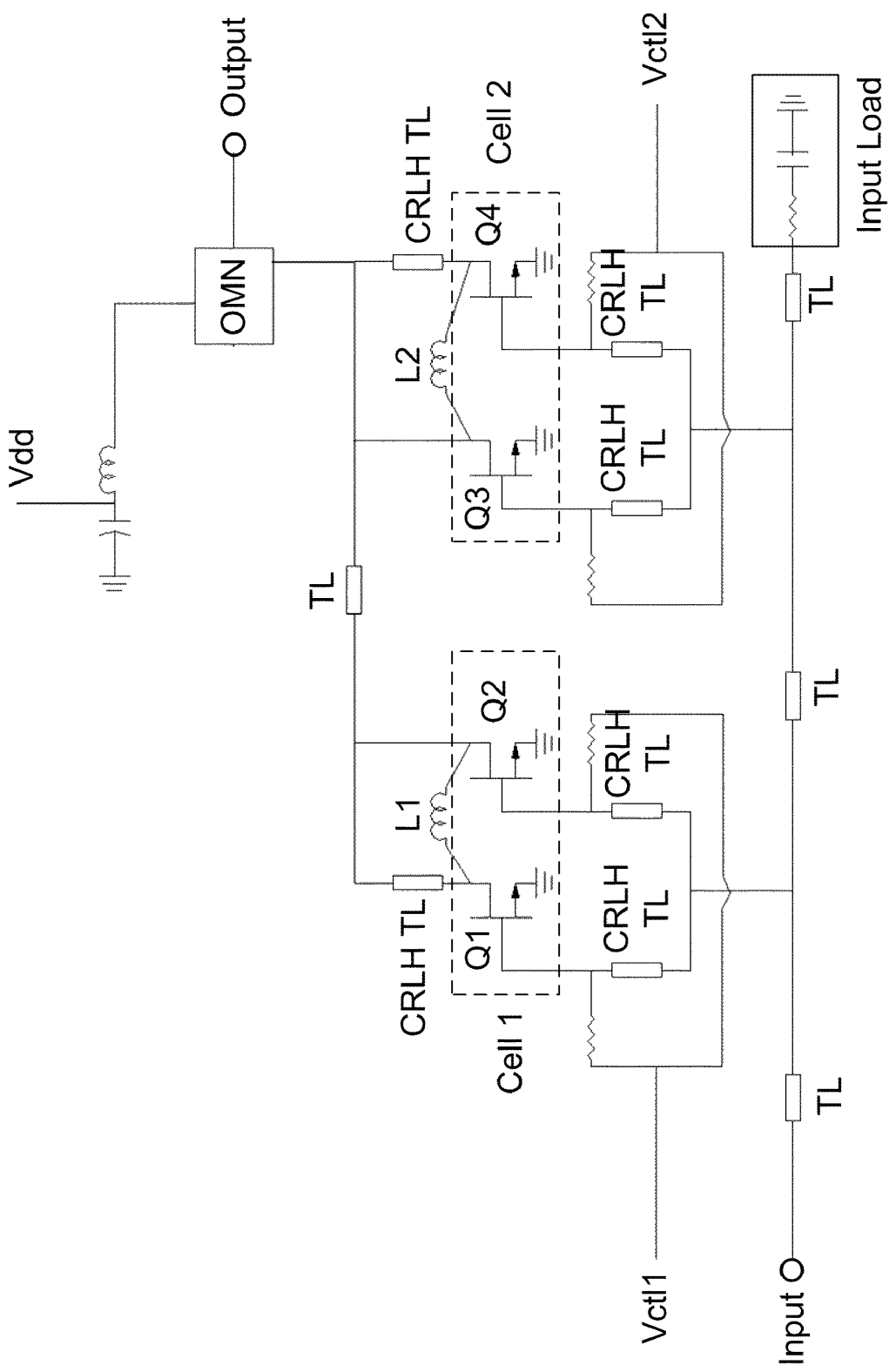
FIG. 8 shows a schematic of an exemplary VPA, which includes four banks, Q1-Q4.

FIG. 8 shows a schematic of an exemplary VPA based on the VPA design in FIG. 4. This VPA includes two cells with four banks of transistors Q1-Q4. The banks Q1 and Q2 are included in cell 1 and commonly controlled by the control voltage Vctl1. The banks Q3 and Q4 are included in cell 2 and commonly controlled by the control voltage Vctl2. Commercial or other pHEMT packages (e.g., the off-the-shelf surface mount version) can be used for Q1-Q4 for an implementation using an FR-4 PCB. The input load is included to absorb input reflections. Different from the switchable OMN shown in FIG. 6, a non-switchable version can be used for the OMN circuit. A supply voltage, Vdd, is applied to Q1-Q4. In this figure, a conventional non-MTM transmission line is denoted as "TL" and a CRLH-based transmission line is denoted as "CRLH TL". The CRLH transmission lines can be used to offset the physical lengths required to implement the packaged devices in this example. CRLH transmission lines can also be used to reduce signal loss and provides improved impedance matching and phase matching. At least one transmission line can be implemented by the CRLH structure depending on the specific requirements and needs of a particular device. In some designs, all transmission lines may include a CRLH MTM structure. In other implementations, non-MTM TLs can be used for all the transmission lines.

Figure 9:
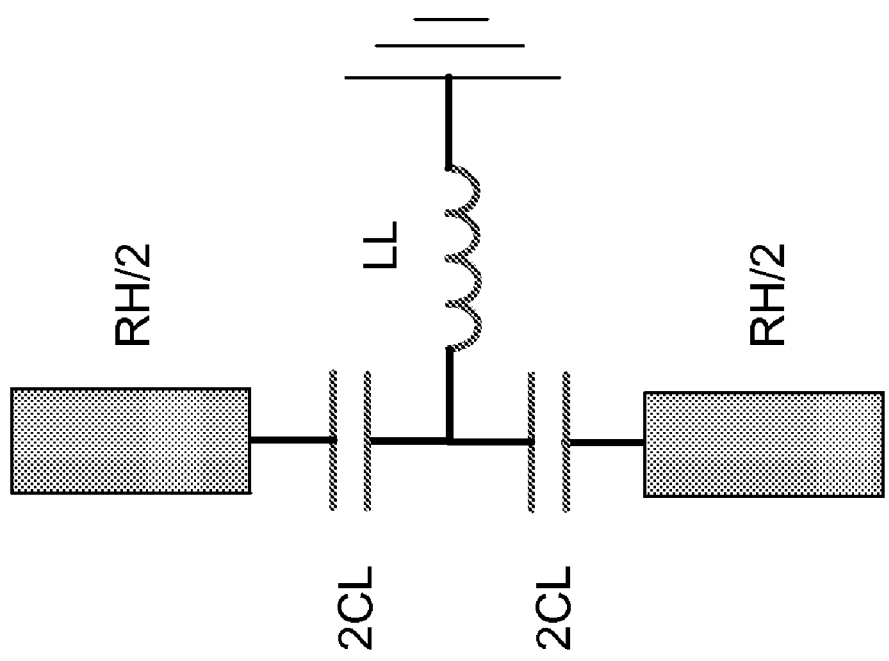
FIG. 9 shows an example of an CRLH unit cell using the symmetric representation.

FIG. 9 shows an example of the CRLH unit cell for constructing a MTM circuit (e.g., a TL or matching network) used in the present PA designs. A symmetric representation is used for this case, where RH refers to a right-handed transmission line, CL refers to a left-handed series capacitor, and LL refers to a left-handed shunt inductor. The RH transmission line equivalently provides a right-handed series inductor, LR/2, and a right-handed shunt capacitor, 2CR. The present VPA implementation uses lumped elements for CL and LL. The CRLH transmission lines can be used to effectively shorten the electrical lengths, thereby leading to size reduction. Referring back to FIG. 8, due to the capacitance introduced by the use of the CRLH transmission lines, inductors, L1 and L2, are added to connect the drains of Q1 and Q2 and those of Q3 and Q4, respectively, to maintain the same bias point for the two banks (Q1 and Q2 in cell 1; Q3 and Q4 in cell 2).

Figure 10:
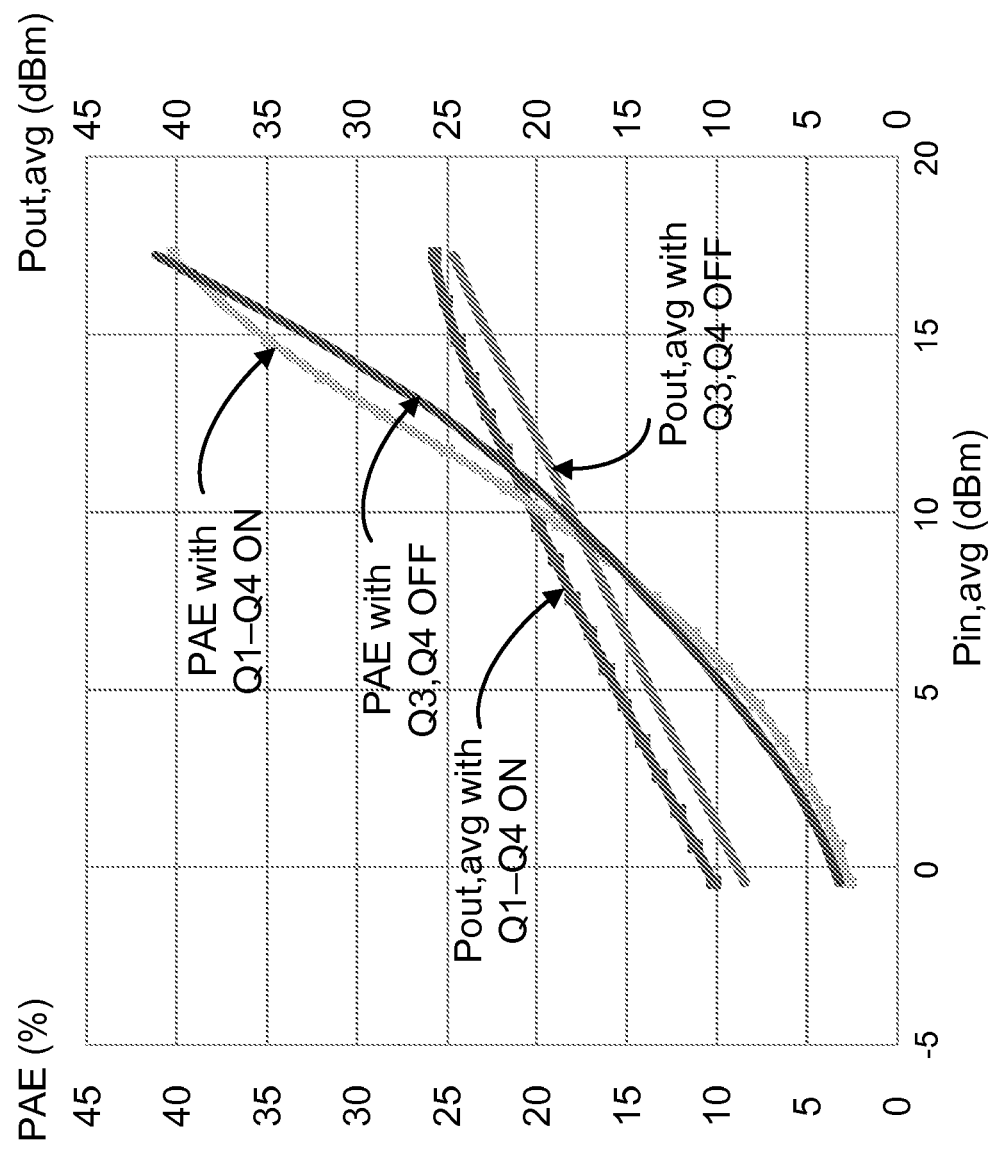
FIG. 10 shows measurement results of Pout,avg and PAE as a function of Pin,avg for the VPA implementation based on the schematics shown in FIG. 8.

FIG. 10 shows measurement results of Pout,avg and PAE as a function of Pin,avg for the VPA implementation based on the schematics shown in FIG. 8. The case of Q1-Q4 all on and another case of Q3 and Q4 off (Q1 and Q2 on) are compared in this figure. As evident from these measurement results, the output power decreases when the two banks are off, but the PAE remains nearly the same between the two cases.

Figure 11:
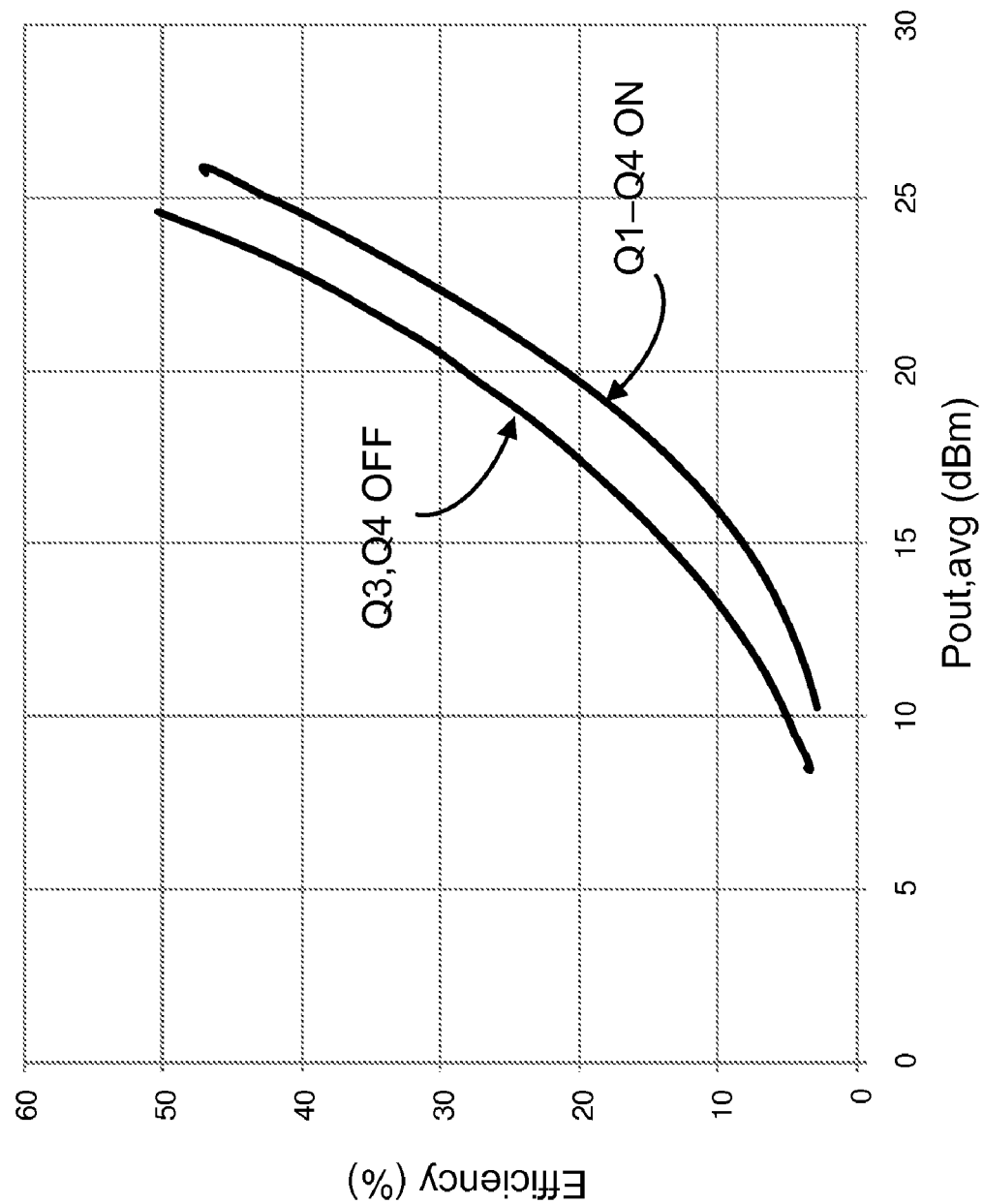
FIG. 11 shows measurement results of efficiency as a function of Pout,avg.

FIG. 11 shows measurement results of efficiency as a function of Pout,avg. The improved efficiency is obtained when Q3 and Q4 are off over the entire measurement range.

In the present VPA designs, the power level of the VPA can be varied by switching on and off one or more transistor banks. The VPA in this architecture can initially have at least one bank on and at least one bank off. The VPA can be configured so that the initially off bank is controlled to turn on under a certain condition, thereby increasing the output power while increasing amplifier linearity. Thus, higher efficiency at power back-off can be obtained in the VPA while meeting wireless system linearity requirements in terms of, for example, Adjacent Channel Power Ratio (ACPR) and Error Vector Magnitude (EVM). It can be configured that the off transistor banks are turned on when peak RF signals are detected by incorporating a feedback mechanism with the VPA. This technique is termed Peak Power Linearization (PPL) in this document and increases the amplifier's ability to provide peak power levels needed for signals such as OFDM by increasing the power saturation level as peak signals are detected. The VPA-based architecture incorporating the PPL scheme is termed Adaptive Current-draw Envelope-detection (ACE) Power Amplifier (PA) herein. The details are given below.

In various implementations, a PA linearization technique involves comparing the amplitude and phase of the RF signal envelope at the output with those at the input to make appropriate corrections through a feedback loop. Examples of linearization techniques in PA architectures for addressing the power back-off situation include feed-forward techniques, digital pre-distortion techniques, linear amplification with non-linear components, and envelope elimination and restoration. Details of some linearization techniques in PA architectures can be found, for example, in Chap. 9 of the book by Cripps entitled "RF Power Amplifiers for Wireless Communications," published by Artech House (1999).

The PPL technique incorporated with the VPA described in this document can be implemented using various established integrated circuit and module practices without requiring system level changes.

Figure 12:
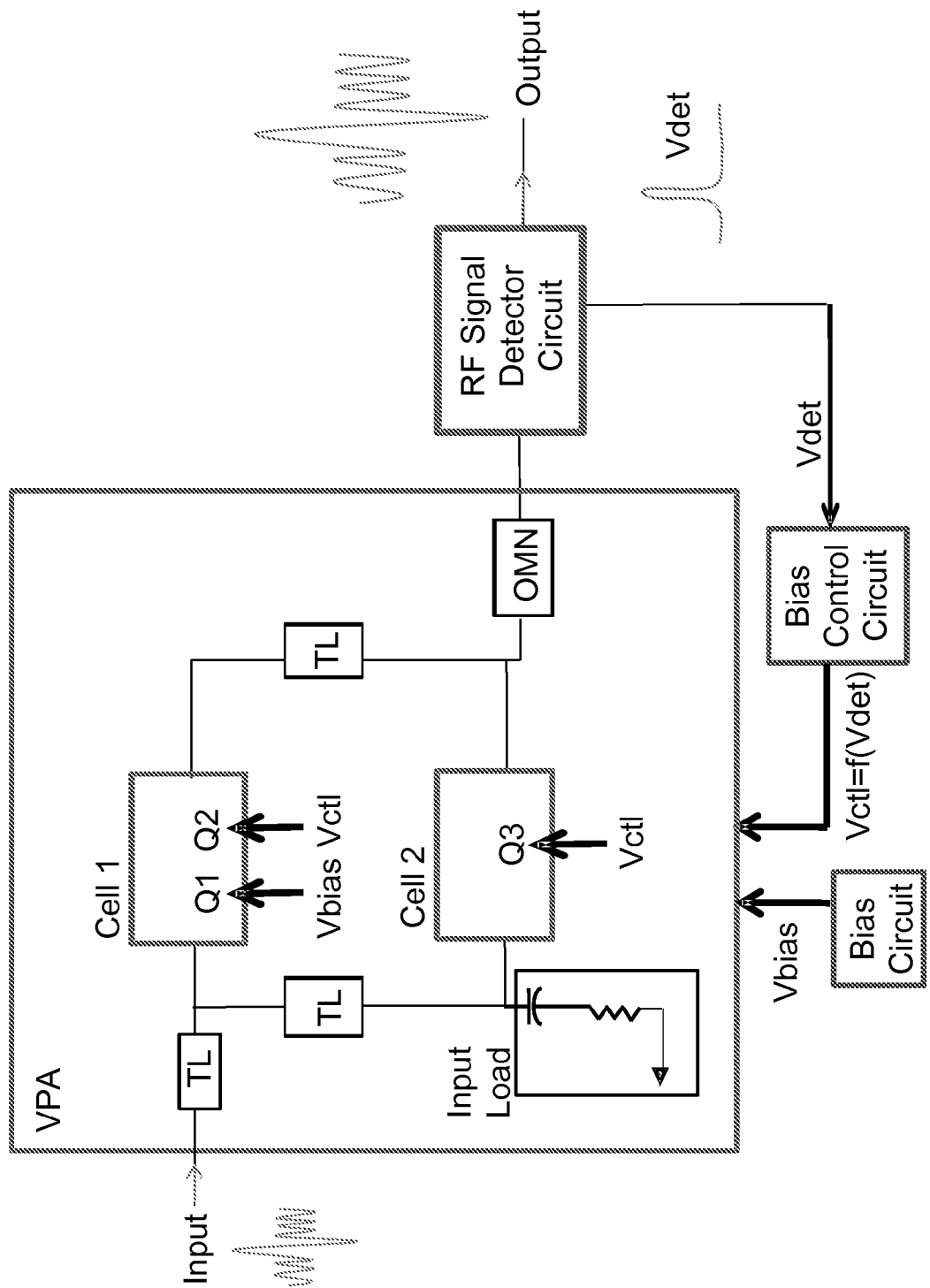
FIG. 12 shows a block diagram of an exemplary ACE PA architecture, which includes a VPA, an RF signal detector circuit, a bias circuit and a bias control circuit.

FIG. 12 shows a block diagram of an exemplary ACE PA architecture. This ACE PA includes a VPA that amplifies the input signal, an RF signal detector circuit that provides a detection mechanism for a feedback control, a bias circuit that provides a bias in the control of the VPA and a bias control circuit that controls the bias to the VPA in combination with the bias circuit. This VPA is a specific example of the VPA shown in FIG. 4, in which cell 1 includes two banks of segmented transistors, Q1 and Q2, and cell 2 includes one bank of segmented transistors, Q3. The segmentation allows off banks to turn on at power levels determined by the RF signal detector circuit and the associated feedback mechanism based on the RF signal detection. The RF signal detector circuit may include a resistive coupler network and a diode, for example. The bias control circuit may include resistors and an op-amp and be implemented on chip or in other existing IC components. A voltage summer and a current mirror are examples of bias control circuits that can be used in the ACE PA.

The PPL technique can be implemented based on two or more banks of segmented transistors in the VPA, coupled with the RF signal detector circuit and bias control circuit. As mentioned earlier, various types of transistors can be used to form the banks. This example utilizes FET-type transistors with the gate voltages supplied from the bias circuit and the bias control circuit to the VPA. Specifically, the two banks in cell 1, Q1 and Q2, are controlled by Vbias and Vctl, respectively, and the one bank in cell 2, Q3, is controlled by Vctl, as indicated in the figure. Initially, the bias circuit applies Vbias to turn on Q1, which will be biased on throughout the process. The RF signal detector circuit detects the RF signal waveform, and converts it to a DC voltage, Vdet. The RF signal detector circuit can be configured to detect the RF power or voltage signal waveform. The peaks in the detected RF signal correspond to the peaks in Vdet for non-constant envelope signal waveforms. The detected voltage Vdet is fed to the bias control circuit, which outputs Vctl to turn on the banks Q2 and Q3. Vctl is a function of Vdet. For example, if a voltage summer is used as the bias control circuit, Vctl can be given by Vbias+Vdet.

In the ACE PA architecture, the number of cells, the number of banks in a cell, and the number of transistors in a bank can be varied, together with the bias control scheme. For example, the ACE PA can be configured to include first and second banks in cell 1 and third and fourth banks in cell 2, where the first and third banks are initially biased on with Vbias, the second bank is turned on with Vctl1, and the fourth bank is turned on with Vctl2 that is different from Vctl1 in terms of value and/or timing.

Figure 13:
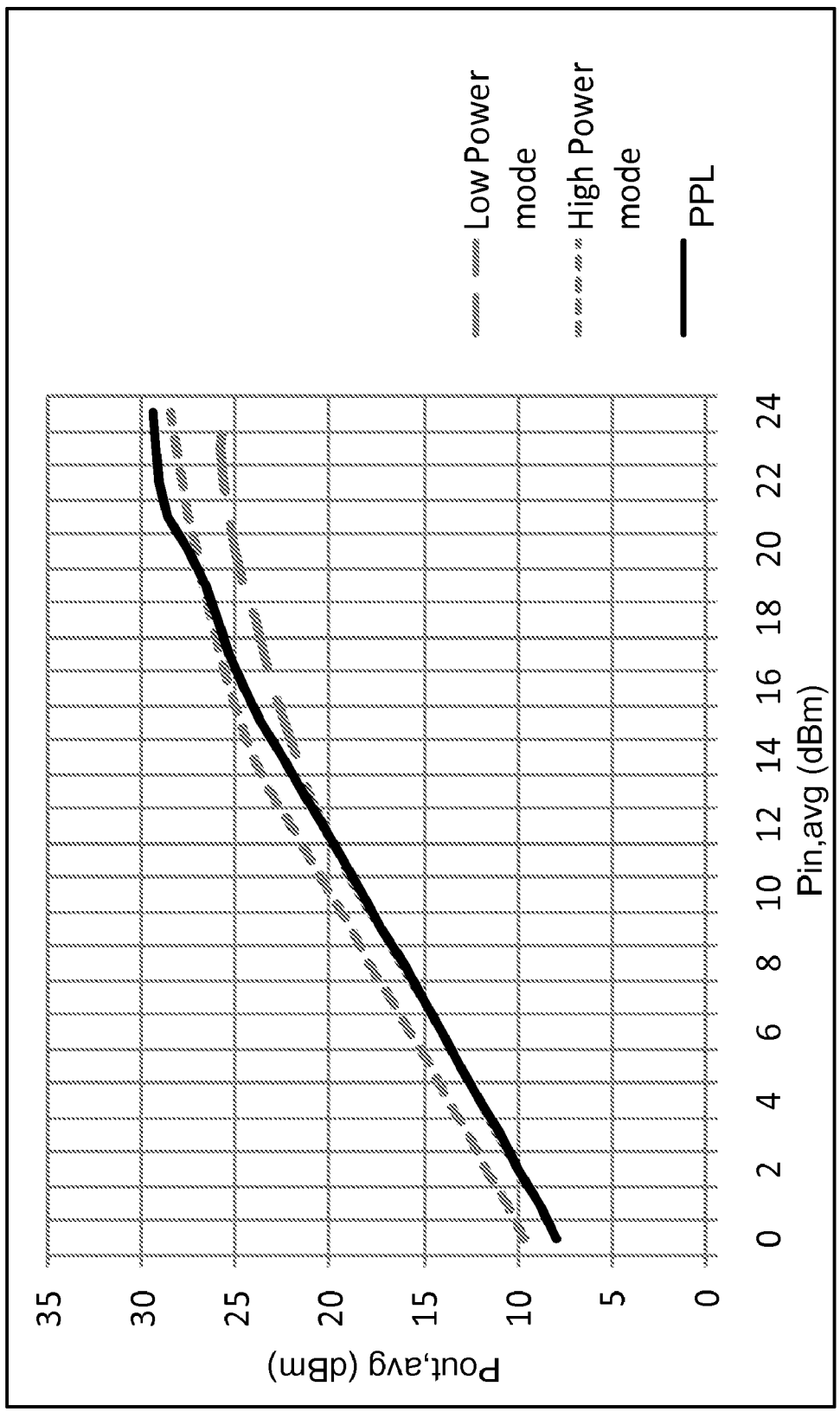
FIG. 13 shows simulation results of average output power (Pout,avg) versus average input power (Pin,avg) for the cases of a low power mode, a high power mode and the Peak Power Linearization (PPL).

FIG. 13 shows simulation results of average output power (Pout,avg) versus average input power (Pin,avg) for the cases of a low power mode, a high power mode and the PPL. The low power mode refers to a situation in which the minimum number of banks are biased on. In the present example, only the bank Q1 is on. The high power mode refers to a situation in which all the banks are biased on. In the present example, all the three banks Q1, Q2 and Q3 are on. A continuous wave (CW) is used for the RF signals in this simulation. An example of the continuous wave includes a sinusoidal wave with a constant envelope. The DC voltage conversion by the RF signal detector circuit provides a substantially constant Vdet value as a function of time for the constant envelope signal. Vdet is then fed into the bias control circuit, which outputs Vctl as a function of Vdet so as to control the drain current of the banks Q2 and Q3. When Q2 and Q3 are on, the collective drain current from cell 1 and cell 2 increases, thereby leading to the increase in the output power. As the input power increases, Vdet and hence Vctl increase. When the input power is still low (i.e., Pin,avg less than about 12 dBm in FIG. 13), Vdet and Vctl are low. Thus, the drain current from Q2 and Q3 are still negligible, and the output power curve follows the low power mode curve. At about Pout,avg=20 dBm (Pin,avg=12 dBm), Vdet and hence Vctl reach a point to increase the drain current from Q2 and Q3, and thus the output power deviates from the low power mode. The drain current increases with the increase in Vctl in the way similar to the current-voltage characteristics for a diode to provide the full output power corresponding to the high power mode at about Pout,avg=28 dBm, as shown in FIG. 13. Thus, the linear region is expanded to about 28 dBm by use of the ACE PA that incorporates the PPL scheme with the VPA.

Figure 14:
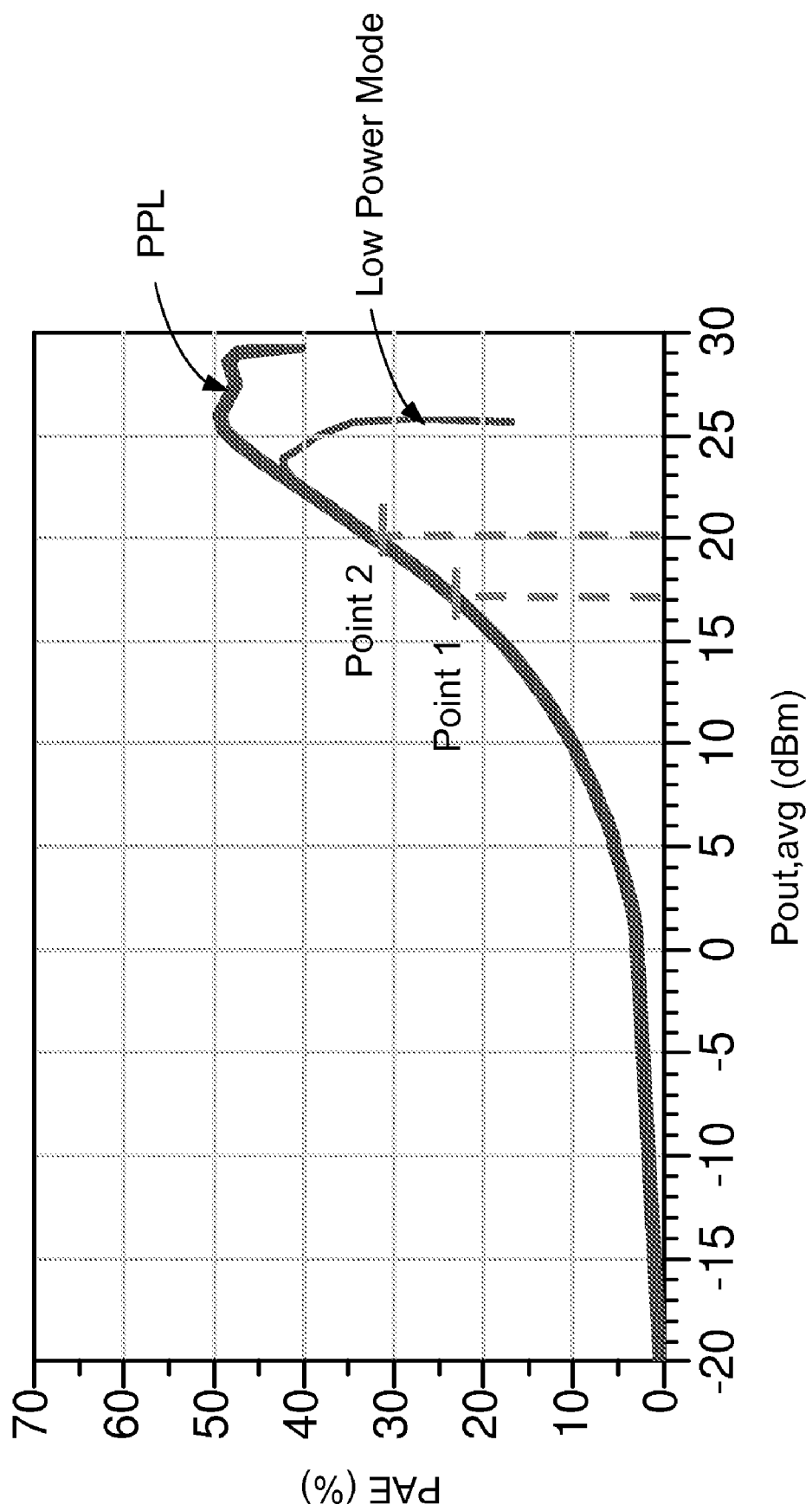
FIG. 14 shows power added efficiency (PAE) versus average output power (Pout,avg) for the cases of the low power mode and the Peak Power Linearization (PPL).
Figure 15:
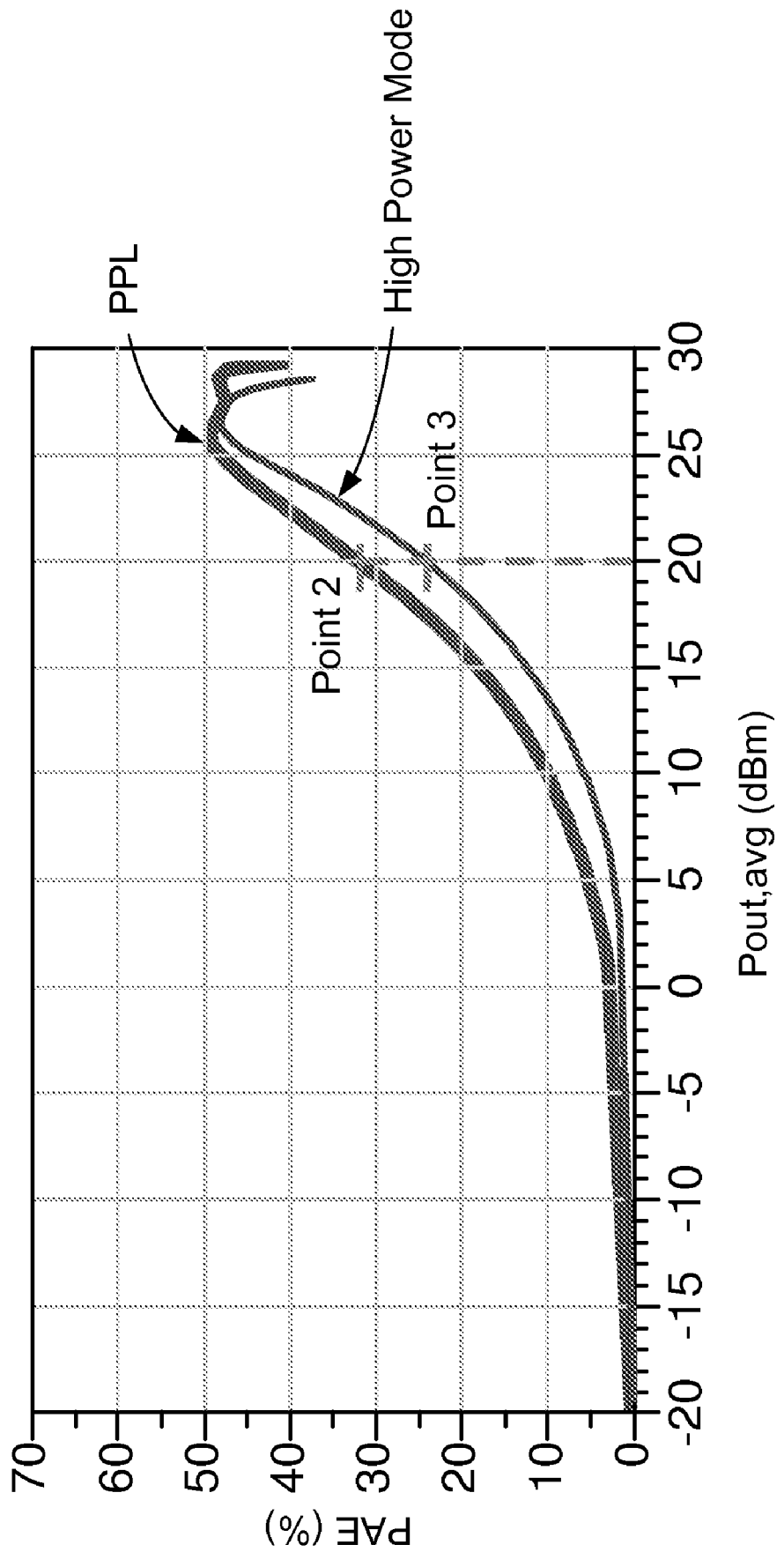
FIG. 15 shows PAE versus Pout,avg for the cases of the high power mode and the Peak Power Linearization (PPL).

FIG. 14 shows power added efficiency (PAE) versus average output power (Pout,avg) for the cases of the low power mode and the PPL. Similarly, FIG. 15 shows PAE versus Pout,avg for the cases of the high power mode and the PPL. Both are simulation results based on the same conditions as in FIG. 13. Without the PPL scheme of the ACE PA, PAE at back-off where EVM requirements are met is at point 1 of the low power mode curve in FIG. 14, where Pout,avg is backed off to 17 dBm, and at point 3 of the high power mode curve in FIG. 15, where Pout,avg is backed off to 20 dBm. As the PPL technique of the ACE PA is employed, PAE at back-off, which is about 20 dBm, moves up to point 2 as shown in the figures.

In the present PA designs with two or more cells having transistors for signal amplification, each cell includes one or more banks of transistors and different cells may have different number of transistors. For certain applications, a two-cell PA may be implemented to include a first cell with two banks of one or more transistors and a second cell with one bank of one or more transistors to provide sufficient power amplification while maintaining a small number of banks of transistors for a compact circuit size and simple fabrication. Within each bank in the two cells, the source terminals of the transistors are connected to one another, the gate terminals of the transistors are connected to one another, and the drain terminals of the transistors are connected to one another. Three control voltages are applied to the three banks of transistors in this two-cell PA design: two control voltages are for the two banks in the first cell and one control voltage is for the single bank in the second cell. In an example using BJTs, within each bank, the emitter terminals of the transistors are connected to one another, the base terminals of the transistors are connected to one another, and the collector terminals of the transistors are connected to one another. Control currents, i.e., base currents, are applied to the respective banks of transistors in this example.

Figure 16:
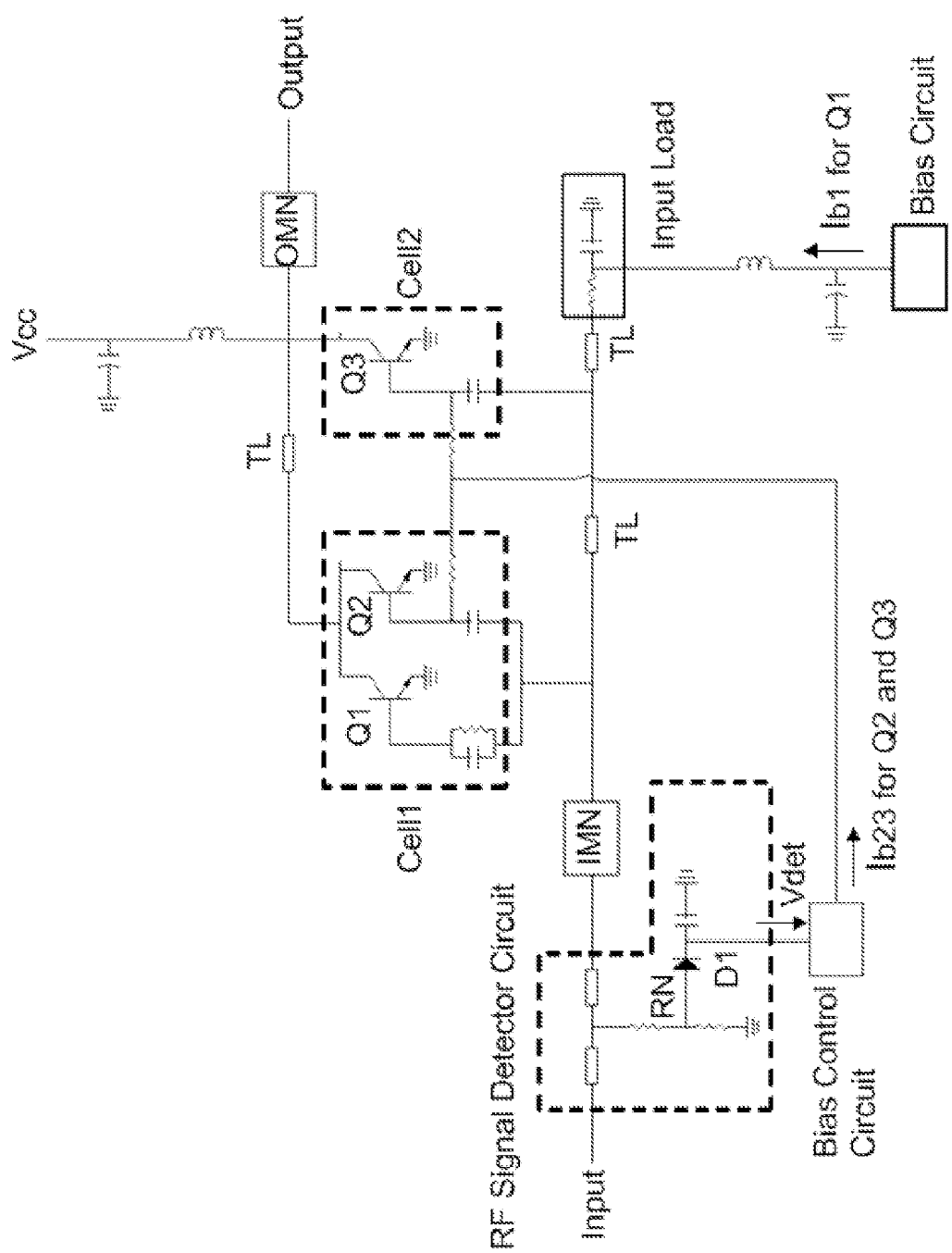
FIG. 16 shows a schematic of another exemplary ACE PA architecture, including a VPA, an RF signal detector circuit, a bias circuit and a bias control circuit.

FIG. 16 shows a schematic of another exemplary ACE PA architecture, including a VPA with two cells 1 and 2, an RF signal detector circuit, a bias circuit and a bias control circuit. Cell 1 includes two banks of segmented transistors, Q1 and Q2, and cell 2 includes one bank of segmented transistors, Q3. Some differences between the ACE PA in FIG. 12 and the one in FIG. 16 are the following: (i) the RF signal detector circuit is placed at the input side in FIG. 16 rather than the output side in the design in FIG. 12; and (ii) BJT-type transistors are used to form the banks Q1, Q2 and Q3 with the supply voltage denoted as Vcc in FIG. 16; and (iii) the bias control circuit converts Vdet to base current Ib23 for controlling the collector current of the banks Q2 and Q3 in FIG. 16. In the example in FIG. 16, an input matching network (IMN) is used, in addition to OMN, for optimizing the input impedance matching. Initially, the bias circuit applies Ib1 to turn on Q1, which is biased on throughout the operation. The RF signal detector circuit in this example includes a resistive coupler network (RN) and a diode (D1) to detect the input RF signal waveform and convert it to a DC voltage, Vdet. The detected voltage Vdet is fed to the bias control circuit, which outputs the bias current Ib23 to control the collector current of the banks Q2 and Q3. As the input power increases, Vdet and hence Ib23 increase. The collector current from Q2 and Q3 increases with the increase in Ib23 in the way similar to diode-type I-V characteristics, eventually providing full output power corresponding to the high power mode. The DC conversion level for Vdet can be adjusted by using the RF coupling value of the resistive coupler network (RN) in the RF signal detector circuit in this example. Too much coupling can lead to unwanted large gain expansion that produces undesired signal distortion as well as a decrease in the efficiency since the current is drawn too early. On the other hand, too little coupling can decrease the detection range of the RF signal detector circuit. The optimum DC conversion level can be predetermined based on target power and efficiency levels.

Figure 17A:
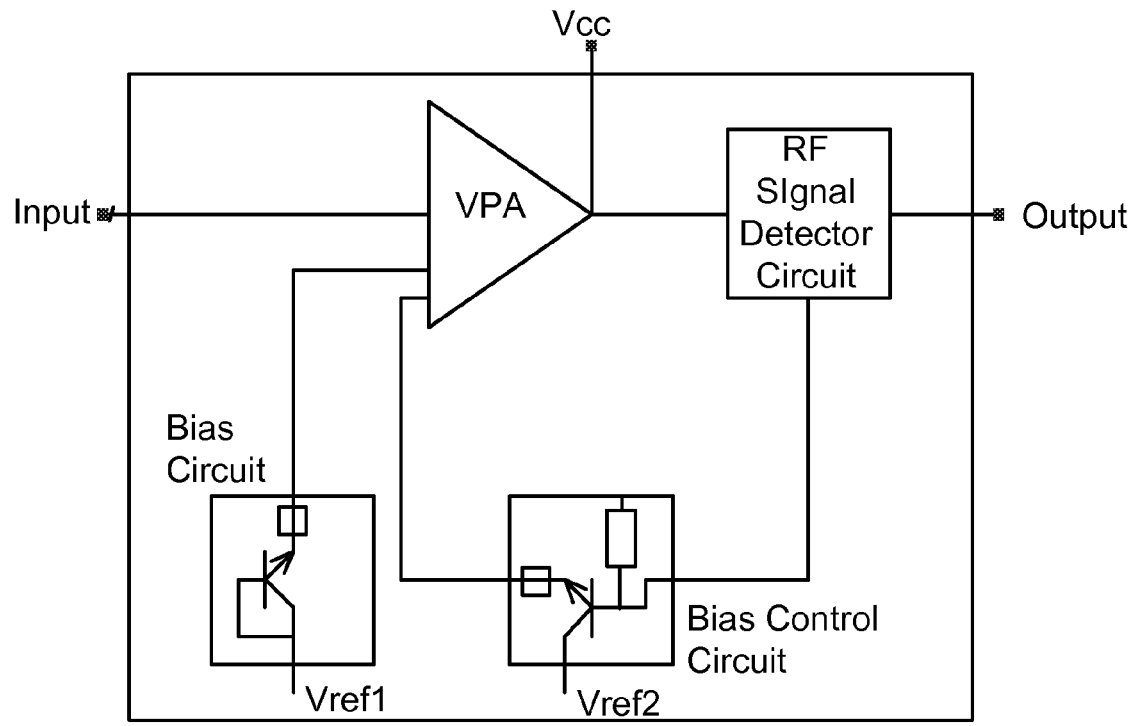
FIGS. 17A and 17B show a block diagram schematic of the ACE PA with the RF signal detector circuit at the output side to detect the output RF signal and at the input side to detect the input RF signal, respectively.
Figure 17B:
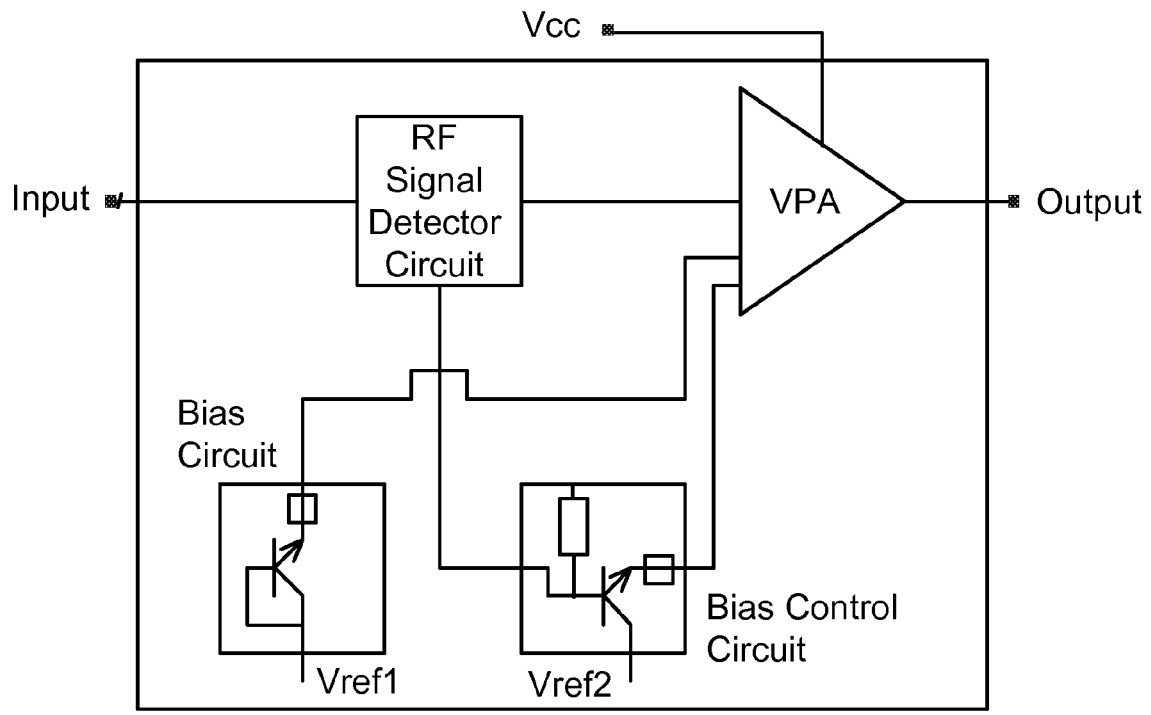

FIGS. 17A and 17B show a block diagram schematic of the ACE PA with the RF signal detector circuit at the output side to detect the output RF signal and at the input side to detect the input RF signal, respectively. In general, the RF signal detector circuit at the input side is less sensitive to output load variations and can be configured to handle less power than the output power detection. The ACE PA provides the option of having the RF signal detector circuit either at the input side or output side depending on target applications and possible space constraints.

Figure 18:
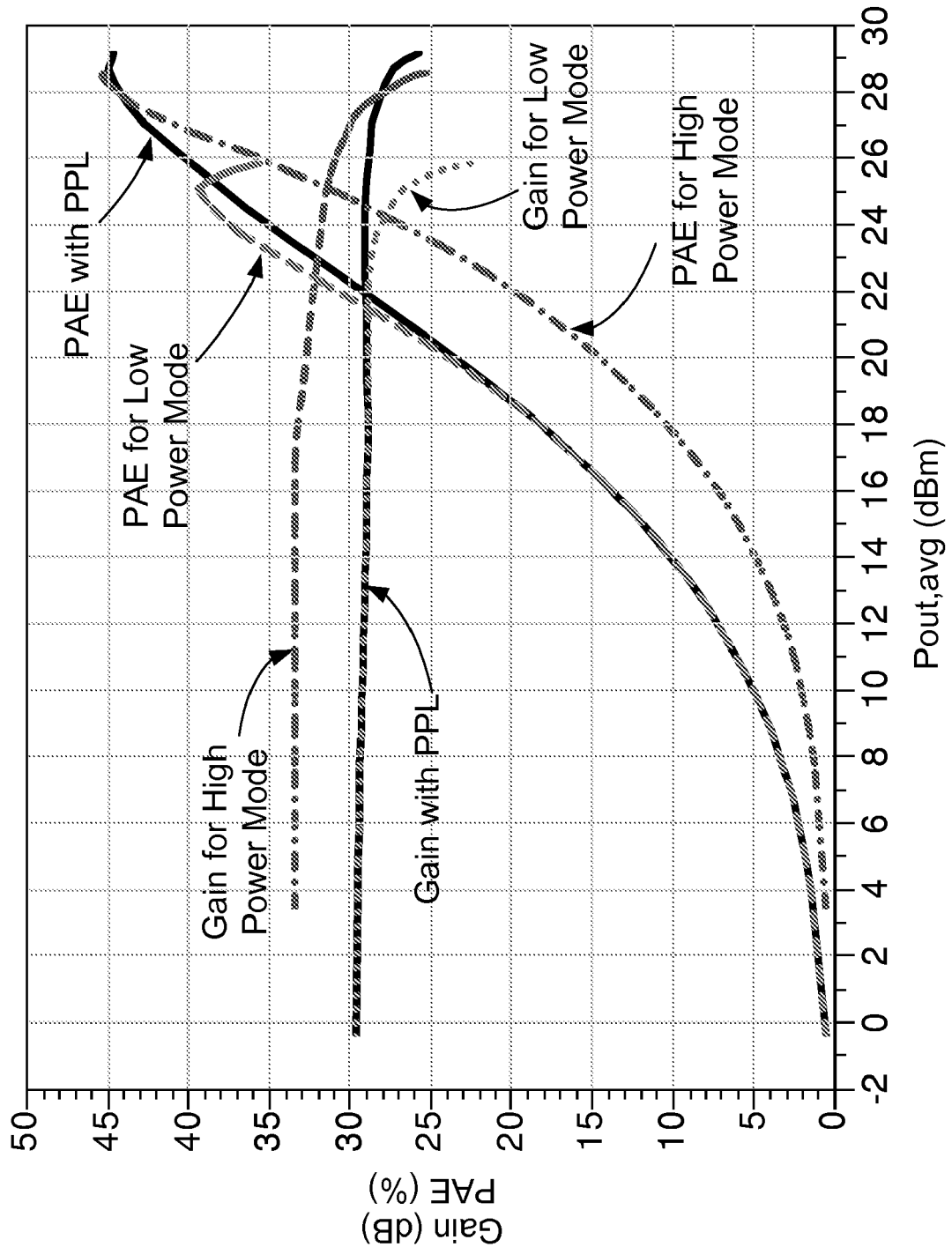
FIG. 18 shows simulation results of PAE versus Pout,avg and gain versus Pout,avg of the ACE PA, for the cases of the high power mode, the low power mode and the Peak Power Linearization (PPL).

FIG. 18 shows simulation results of PAE versus Pout,avg and gain versus Pout,avg of the ACE PA, for the cases of the high power mode, the low power mode and the PPL. This simulation is based on a Monolithic Microwave Integrated Circuits (MMIC) implementation using the schematic shown in FIG. 16. The high power mode refers to the situation where all the banks are on; and the low power mode refers to the situation where the minimum number of banks are on. In this example, the banks Q1-Q3 are on in the high power mode; and only the bank Q1 is on in the low power mode. Gain is defined as Pout,avg/Pin,avg which gives a substantially constant value in the linear region. As evident from this figure, the gain with the PPL remains substantially constant over a wider range of Pout,avg than the cases of the high and low power modes. The PAE with the PPL is substantially higher than the PAE for the high power mode, while showing very little degradation from the low power mode. The power back-off point where the EVA requirements are met for the PPL case is about 21 dBm in this example. Thus, the use of the ACE PA incorporating the PPL improves the PAE at this back-off point by about 10%, as shown in this figure.

FIG. 19A shows an example of an OFDM signal with Pin,avg=15 dBm, illustrating the non-constant envelope in input voltage Vin. The RF signal detector circuit at the input side of the ACE PA detects the Vin waveform, and converts it to the detected voltage Vdet. A DC conversion is used in this example. For non-constant envelope signals, Vdet obtained by the DC conversion is time varying, and peaks in the Vin waveform correspond to peaks in Vdet. FIG. 19B shows the time variation of Vdet, which is fed into the bias control circuit, where Vdet is converted to bias control current Ib23. FIG. 19C shows the time variation of Ib23, which is the base current for the banks Q2 and Q3. The collector current Ic from the banks Q2 and Q3 is time varying as well due to the non-constant envelope of the OFDM input signal. As the input power increases, Vdet and hence Ib23 increase. The collector current Ic increases with the increase in Ib23 in the way similar to diode-type I-V characteristics. Thus, as the Pin,avg value increases, the average Ic and hence Pout,avg increases, leading to improved linearity and high efficiency at the power back-off for non-constant envelope signals as well by use of the ACE PA.

Figure 20A:
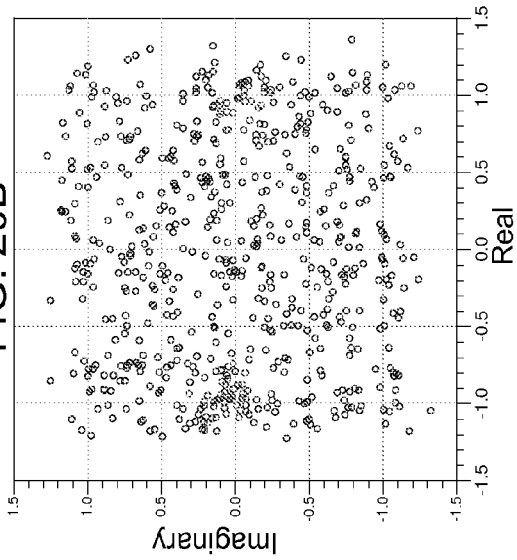
FIG. 20A shows the waveform of output voltage Vout with Pout,avg=21 dBm for a non-constant envelope signal in the low power mode.
Figure 20B:
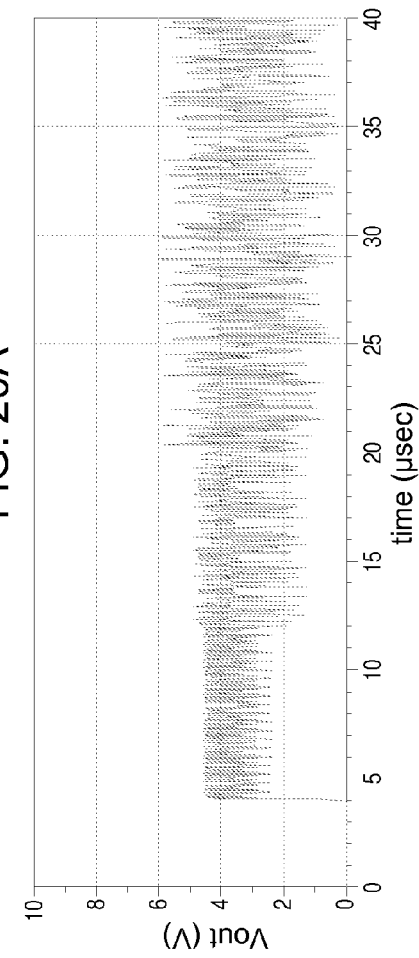
FIG. 20B shows the EVM constellation diagram quantizing the distortion, illustrating non-conformance to the EVM linearity requirements.
Figure 20C:
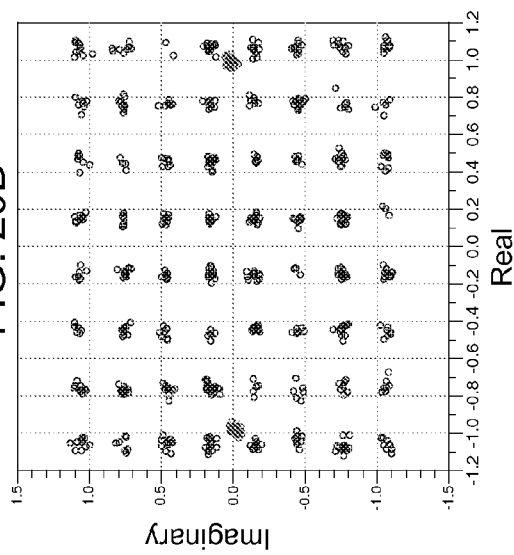
FIG. 20C shows the waveform of output voltage Vout with the same Pout,avg for the case of using the Peak Power Linearization (PPL).
Figure 20D:
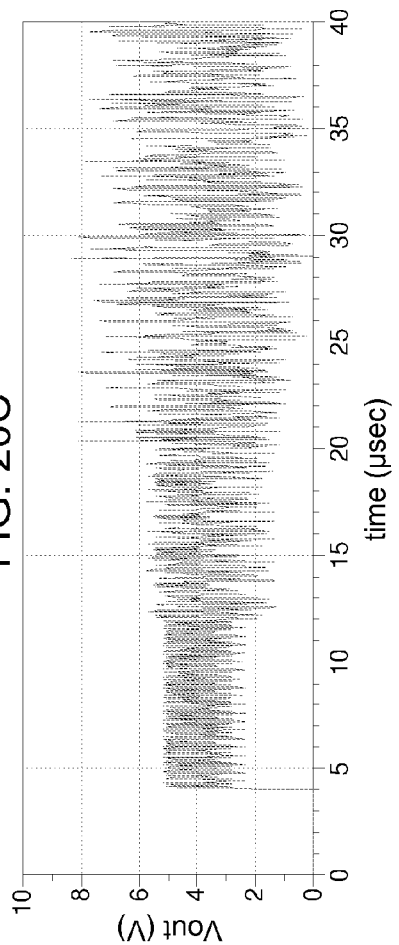
FIG. 20D shows the EVM constellation diagram quantizing the restoration, illustrating conformance to the EVM linearity requirements.

FIG. 20A shows the waveform of output voltage Vout with Pout,avg=21 dBm for a non-constant envelope signal in the low power mode, where waveform distortion is evident. Generally, Error Vector Magnitude (EVM) is a measure of how far the points are from the ideal lattice points. In the present case, the ideal lattice points correspond to non-distortion. FIG. 20B shows the EVM constellation diagram quantizing the distortion, illustrating non-conformance to the EVM linearity requirements. This necessitates the power back-off that leads to degradation of efficiency, as explained with reference to FIG. 2. FIG. 20C shows the waveform of output voltage Vout with the same Pout,avg for the case of using the PPL, where the restored waveform is observed. FIG. 20D shows the EVM constellation diagram quantizing the restoration, thereby illustrating conformance to the EVM linearity requirements. Thus, linearity and higher efficiencies are achieved at Pout, avg=21 dBm by use of the ACE PA.

Figure 21:
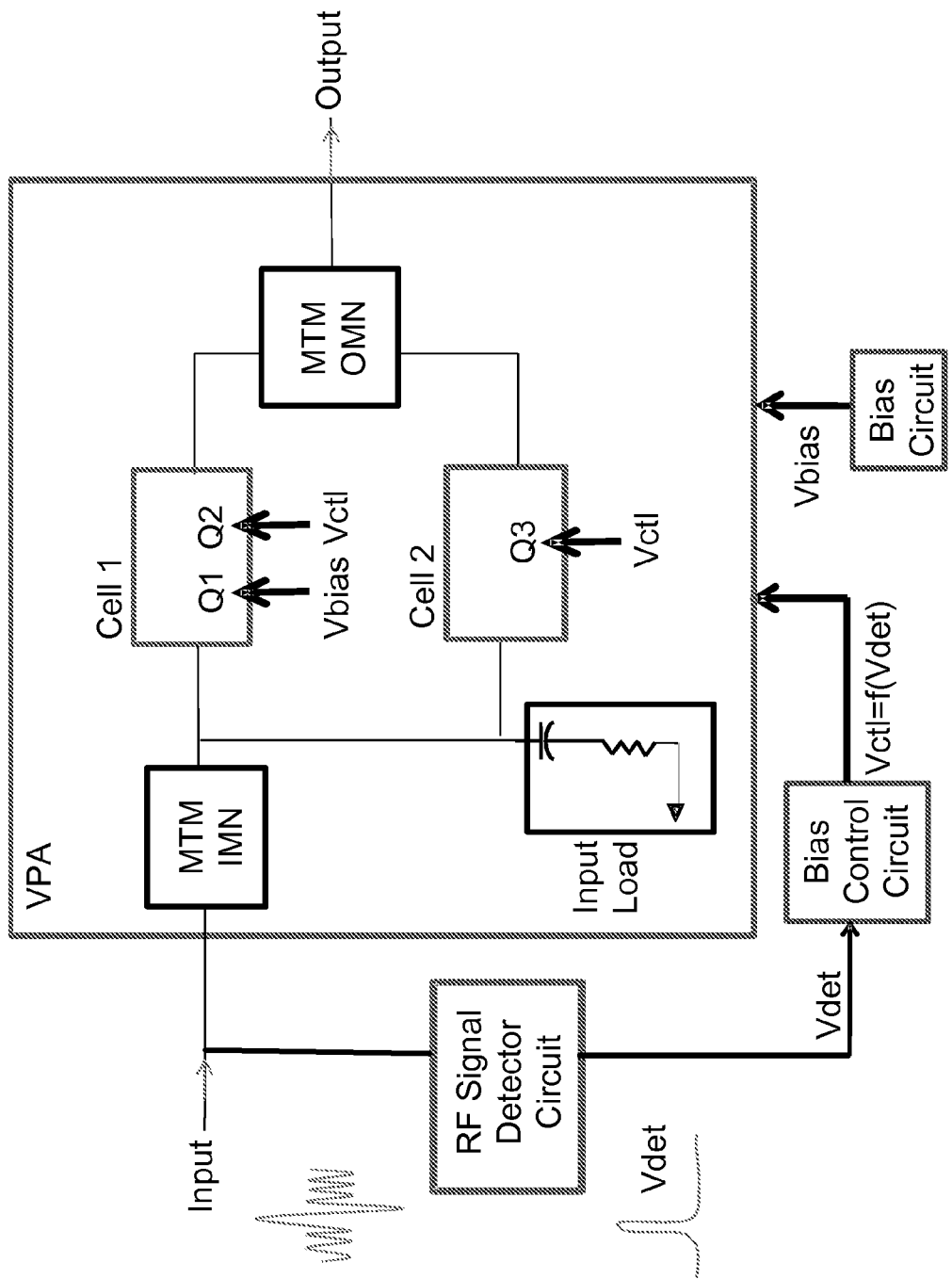
FIG. 21 shows a block diagram of another exemplary ACE PA architecture, where the VPA includes a metamaterial input matching network (MTM IMN) and a metamaterial output matching network (MTM OMN).

FIG. 21 shows a block diagram of another exemplary ACE PA architecture, where the VPA includes a metamaterial input matching network (MTM IMN) and a metamaterial output matching network (MTM OMN). The RF signal detector circuit is placed at the input side in this and following examples. A switchable OMN is illustrated in FIG. 6. A non-MTM OMN, switchable or non-switchable, includes RH components such as a series inductor and a shunt capacitor. The MTM IMN and MTM OMN can be realized by adding LH components such as a shunt inductor and a series capacitor, as shown in the CRLH unit cell example in FIG. 9. The MTM matching network can be structured to provide better matching than a non-MTM matching network. Either the MTM IMN or MTM OMN or both can be included depending on matching conditions and other requirements. The MTM IMN or MTM OMN can also be used to reduce the circuit size, e.g., in FR-4 implementations.

Figure 22:
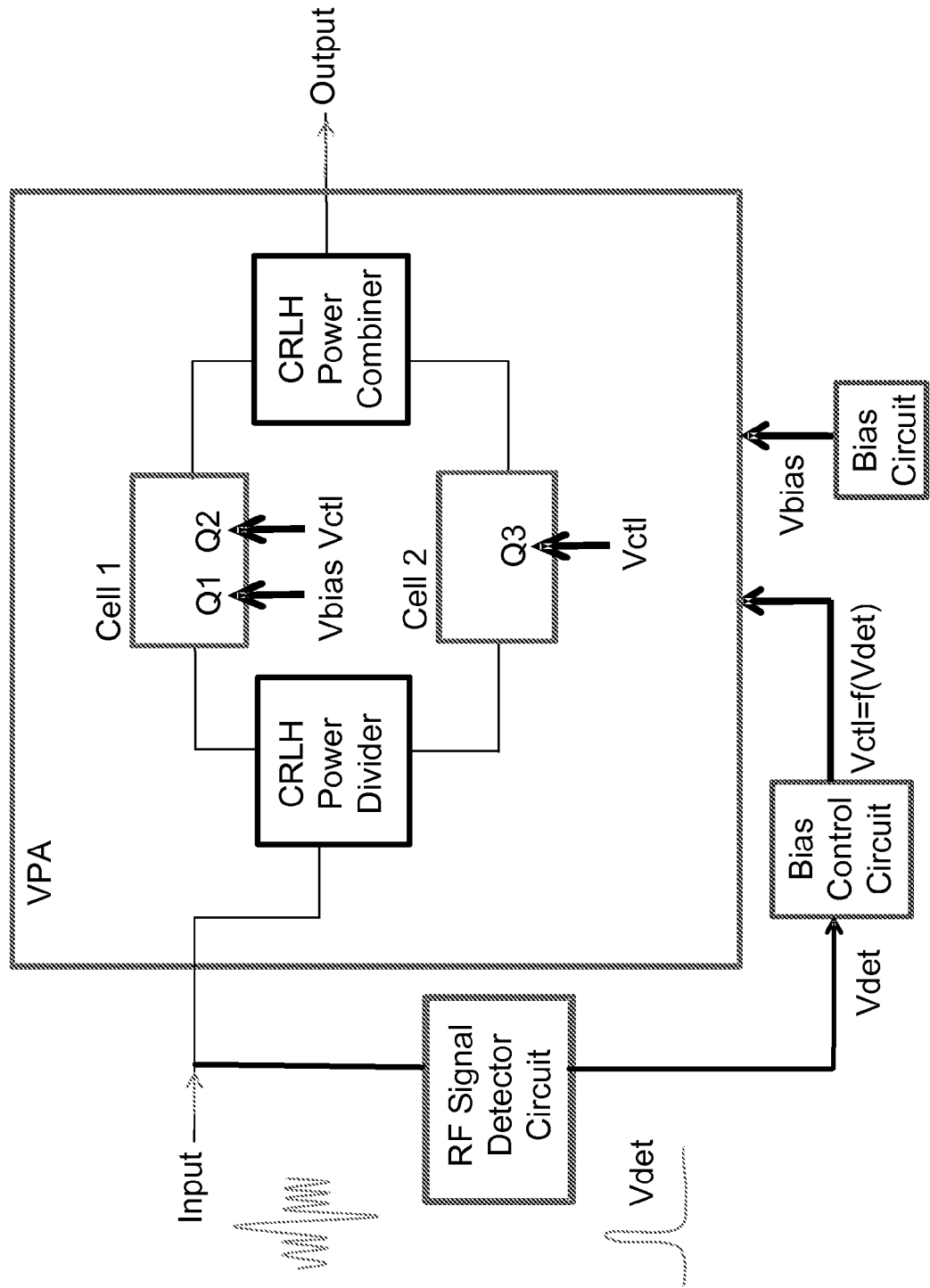
FIG. 22 shows a block diagram of yet another exemplary ACE PA architecture, where the VPA includes a CRLH power divider at the inputs of the cells and a CRLH power combiner at the outputs of the cells.

FIG. 22 shows a block diagram of yet another exemplary ACE PA architecture using the MTM based technology. In this example, a CRLH power divider is used at the inputs of the cells, and a CRLH power combiner is used at the outputs of the cells for providing device matching as well as constructive power combining. Either the CRLH divider or CRLH combiner or both can be included depending on the matching conditions and other requirements. Examples of CRLH power dividers and combiners and other related circuits can be found, for example, in U.S. patent application Ser. No. 11/963,710; and U.S. patent application Ser. No. 61/056,826 entitled "Power Amplifier Architectures for High Efficiency and High Linearity Using Metamaterial Structures," filed on Mar. 28, 2008 which is incorporated herein by reference. The CRLH power combiner or divider can be designed to have an electrical length that corresponds to a phase of 0 degree, a multiple of 180 degrees, a multiple of 90 degrees, etc., enabling flexible impedance matching. Dual-band, multi-band and wideband signal transmissions and receptions can also be achieved by manipulating the CRLH phase response.

Figure 23:
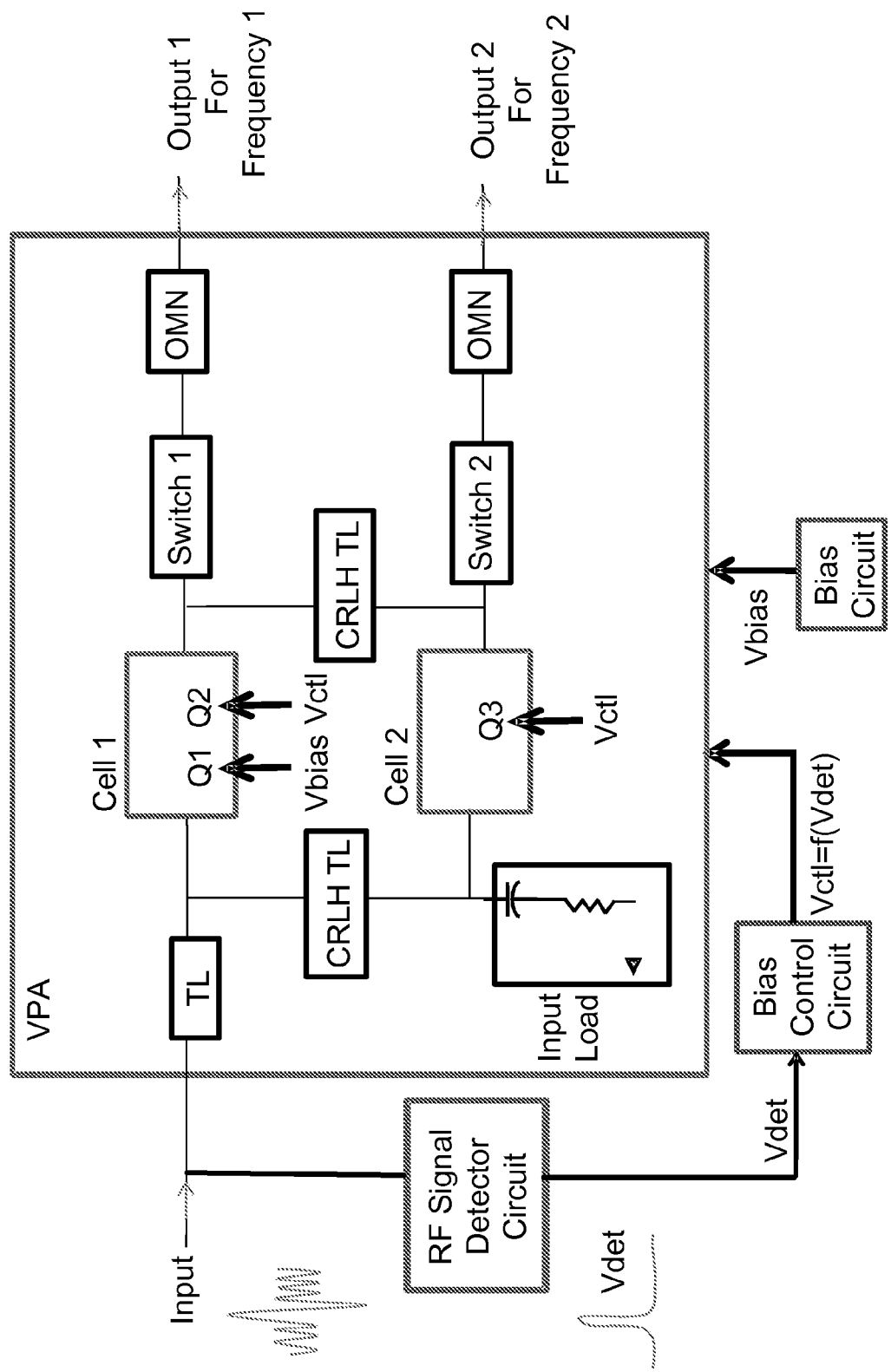
FIG. 23 shows a block diagram of an exemplary ACE PA architecture for dual-band operations using CRLH TLs, where signals with two different frequencies are extracted at the forward and reverse ports, respectively.

FIG. 23 shows a block diagram of an exemplary ACE PA architecture for dual-band operations using CRLH TLs, where signals with two different frequencies are extracted at the forward and reverse ports, respectively. A dual-band distributed amplifier using CRLH TLs and the two-port extraction has been demonstrated by J. Mata-Contreras et al., for example, in "Assessment of a Composite Right/Left-handed Transmission Line-based Distributed Amplifier implemented in microstrip technology," Proceedings of the 36$^{th}$ European Microwave Conference, pp. 1586-1589, 2006; and "Experimental Performance of a Meta-Distributed Amplifier," Proceedings of the 37$^{th}$ European Microwave Conference, pp. 743-746, 2007. In the ACE PA example shown in FIG. 23, an OMN and a switch are provided in each output path for improved matching and isolation. Specifically, switch 1 is off and switch 2 is on to transmit the signal with frequency 2 through output 1, whereas switch 1 is on and switch 2 is off to transmit the signal with frequency 1 through output 1, in order to increase or maximize the output power for the respective frequency bands and thus to improve the efficiency.

Figure 24:
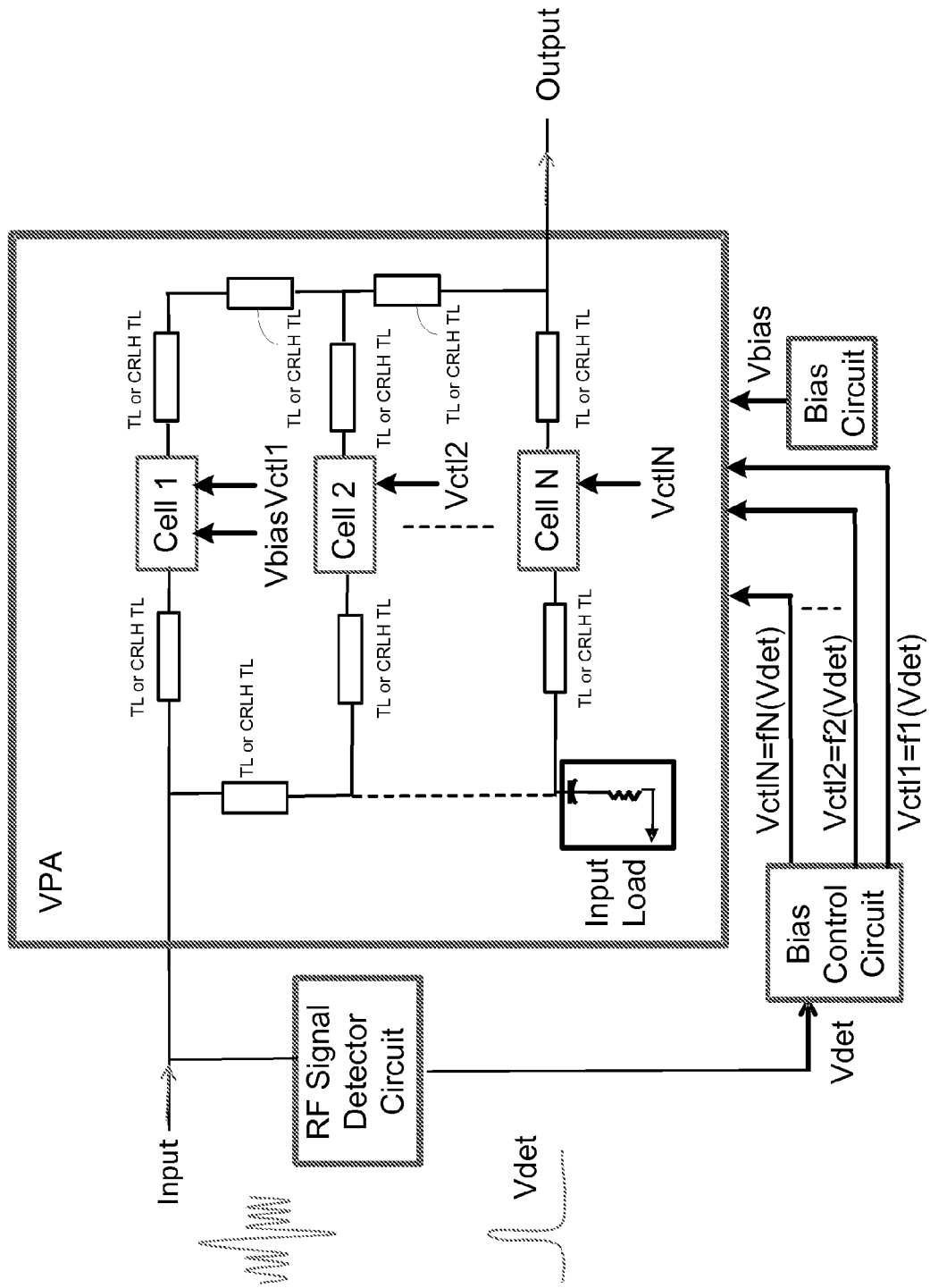
FIG. 24 shows a block diagram of an exemplary ACE PA architecture including multiple cells in the VPA.

FIG. 24 shows a block diagram of an exemplary ACE PA architecture including multiple cells in the VPA. The first cell, cell 1, contains two banks of segmented transistors, one of which is biased on throughout by Vbias and the other is turned on by the control voltage Vctl1 based on the PPL scheme. The second and remaining cells, cell 2-cell N, are configured to contain one transistor bank each in this example, where these banks are controlled by Vctl2-VctlN, respectively. Alternatively, each cell can be configured to include one or more banks, and any one of the banks can be selected as the biased bank with Vbias. The bias control circuit can be configured to output Vctl1-VctlN with different timings and/or different values. In some implementations, a multiple number of bias control circuits can be included, and each bias control circuit receives Vdet and converts it to one of Vctl1-VctlN. Such a variable control of multiple banks provides flexibility in increasing the output power and improves the linearity and efficiency depending on underlying applications and performance requirements. For example, the banks can be turned on sequentially to control the output from the low power to high power. For another example, all the banks other than the biased bank with Vbias can be collectively turned on by a single control voltage Vctl=Vctl1= . . . =VctlN. Generally, wide-band signal transmissions and/or receptions can be achieved by using a distributed power amplifier with multiple cells, each containing a bank of small number of transistors. Based on the small transistor-sizing scheme, the present example of the ACE PA with multiple cells can be adapted for wide-band operations with better linearity and efficiency than a conventional multi-cell distributed PA.

Figure 25:
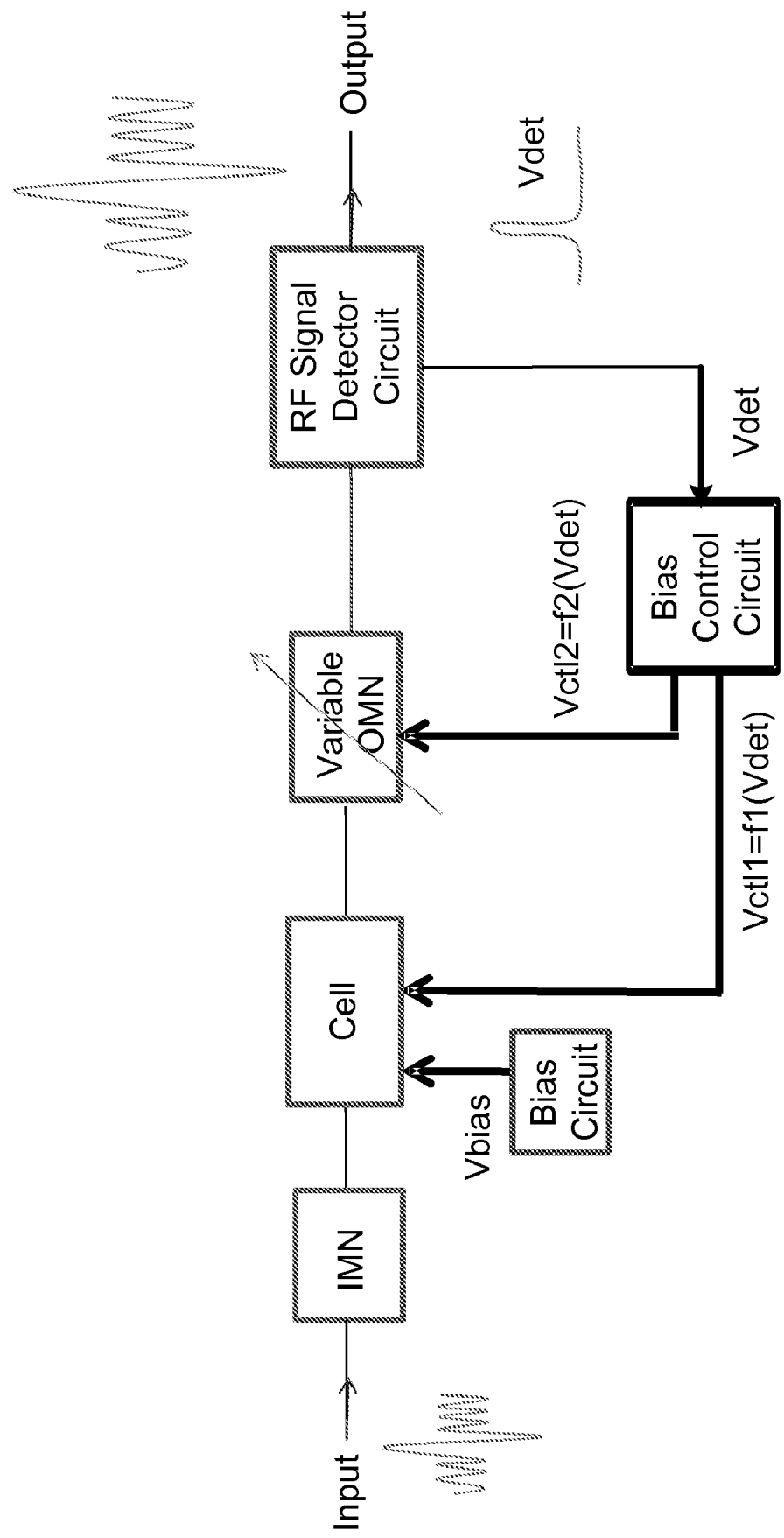
FIG. 25 shows a block diagram of an exemplary ACE PA architecture based on single-cell linear power amplification.

FIG. 25 shows a block diagram of an exemplary ACE PA architecture based on single-cell linear power amplification. In this single-cell configuration, the output power is varied with the use of a single cell that contains two banks of segmented transistors. The RF signal detector circuit is placed on the output side to detect the output RF signal and convert it to the detected voltage, Vdet. Alternatively, the RF signal detector circuit can be placed at the input side to detect the input RF signal. A DC conversion is used in this example. One bank is biased on throughout by Vbias, and the other bank is turned on by Vctl1 as peak signals are detected. The bias control circuit is configured to generate the control voltages, Vctl1 and Vctl2, as a function of Vdet. The variable OMN is turned on/off or biased based on the value of the second control voltage Vctl2. The matching components in the variable OMN are switched on/off or biased depending on the number of transistors in the cell, and help maintain optimum power and efficiency under power back-off conditions as well as at saturated power levels.

In the above implementations that incorporate the PPL scheme in various ACE PA architectures, at least one bank is biased on with Vbias all the time. In other implementations, one of the banks can be configured to have one transistor with high power handling capability with two or more bias levels. The first bias voltage can be applied to keep the lowest level conduction throughout the operation, equivalent to the biased bank in the previous examples, and the second bias control voltage and any additional bias voltages can be applied by the bias control circuit to increase the output power as peak signals are detected.

The ACE PA architectures described in this document can be fabricated in a number of ways. Examples include printing the designs on a conventional FR-4 PCB, and using thin/thick-film ceramic techniques based on alumina or Low Temperature Co-fired Ceramic (LTCC). Another example is a monolithic fabrication. The ACE PA designs presented herein are applicable to most Monolithic Microwave Integrated Circuits (MMIC) semiconductor processes. These include GaAs-, InGaP-, SiGe-, and Si-based fabrication processes. The segmented transistors in the cells of the VPA can be FET, pHEMT, HBT, CMOS, and BiCMOS transistors and the like based on the appropriate device process technology.

Many wireless PAs use InGaP HBT or GaAs HBT. Cost and performance metrics usually determine which process technology is suited for the application. The order of fabrication cost per mm$^2$ from high to low for some existing fabrication processes is GaAs-based processes, SiGe-based processes, and Si-based processes. The Si-based CMOS seems to be promising in providing low cost and good or high performance using some type of distributed approach. CMOS devices can be distributed in such a way that desired power level and good efficiency can be achieved with similar results as their GaAs and SiGe counterparts. Further cost savings can be made if a CMOS PA having the PPL technique is then integrated into the RFIC system chain. In the CMOS technology, the bias control circuit such as a voltage summer can also be placed on-chip. For the pHEMT and HBT technologies, the bias control circuit such as a voltage summer may need to be implemented in an ASIC or using a commercially available op-amp. In the HBT technologies, the bias circuit can also be implemented using an on-chip bias scheme based on current mirrors.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the disclosed implementations and other implementations can be made based on what is described and illustrated.

What is claimed is:

1. A power amplifier device, comprising:
an input port that receives an RF signal to be amplified in power;
an output port that outputs the RF signal that is amplified in power;
a plurality of cells electrically coupled to amplify the received RF signal, each of the cells having a first end coupled to the input port and a second end coupled to the output port and comprising one or more banks of transistors;
a bias circuit that provides a bias signal to turn on at least one bank of transistors in the plurality of cells and maintains a bias at the at least one bank during amplification of the RF signal;
an RF signal detector circuit that detects the RF signal to produce a detected voltage; and
a bias control circuit that receives the detected voltage, produces control signals based on the detected voltage, and supplies, respectively, the control signals to the banks of transistors other than the at least one bank of transistors that is biased on, to control an output current to increase with an increase in the control signals,
wherein the cells, the bias circuit, the RF signal detector circuit and the bias control circuit are configured to increase an output power associated with the output current to increase a linear region and efficiency at a power back-off condition.

2. The power amplifier device as in claim 1, wherein the RF signal detector circuit is coupled to the input port to detect the RF signal associated with an input power.

3. The power amplifier device as in claim 1, wherein the RF signal detector circuit is coupled to the output port to detect the RF signal associated with the output power.

4. The power amplifier device as in claim 1, wherein
the transistors are bipolar junction transistors;
the bias circuit provides the bias signal that is a bias base current for the at least one bank of transistors; and
the bias control circuit provides the control signals that are control base currents determined based on the detected voltage respectively for the banks of transistors other than the at least one bank of transistors.

5. The power amplifier device as in claim 1, wherein
the transistors are field effect transistors;
the bias circuit provides the bias signal that is a bias gate voltage for the at least one bank of transistors; and
the bias control circuit provides the control signals that are control gate voltages determined based on the detected voltage respectively for the banks of transistors other than the at least one bank of transistors.

6. The power amplifier device as in claim 1, wherein the bias control circuit configures at least two of the control signals to be a single control signal based on the detected voltage, and provides the single control signal commonly for at least two of the banks of transistors other than the at least one bank of transistors that is biased on, to control the output current.

7. The power amplifier device as in claim 1, further comprising an input load and an output matching network (OMN).

8. The power amplifier device as in claim 1, further comprising an input matching network (IMN).

9. The power amplifier device as in claim 1, further comprising transmission lines that connect the plurality of cells, the bias circuit, the bias control circuit, the input port, the output port and electronic components, wherein at least a segment of the transmission lines comprises a Composite Right and Left Handed Metamaterial (CRLH MTM).

10. The power amplifier device as in claim 7, wherein the OMN comprises a CRLH MTM.

11. The power amplifier device as in claim 8, wherein the IMN comprises a CRLH MTM.

12. The power amplifier device as in claim 1, further comprising a power divider that has a Composite Right and Left Handed Metamaterial structure to couple the input port to the first ends of the plurality of cells and to provide an impedance matching between the input port and the first ends.

13. The power amplifier device as in claim 1, further comprising a power combiner that has a Composite Right and Left Handed Metamaterial structure to couple the output port to the second ends of the plurality of cells and to provide an impedance matching between the output port and the second ends.

14. The power amplifier device as in claim 1, further comprising:
a first Composite Right and Left Handed Metamaterial (CRLH MTM) transmission line coupling the input port and the first ends of the plurality of cells;
a second CRLH MTM transmission line coupling the output port and the second ends of the plurality of cells;
a first switch coupled to the output port; and
a second switch coupled to the output port,
wherein the output port includes a first output point for outputting a signal at a first frequency and coupled to the first switch which controls the output at the first output point and a second output point for outputting a signal at a second, different frequency and coupled to the second switch which controls the output at the second output point.

15. The power amplifier device as in claim 1, wherein the RF signal detector circuit comprises a resistive coupler network and a diode.

16. The power amplifier device as in claim 1, wherein
the plurality of cells include a first cell and a second cell, the first cell comprising transistors segmented into a first bank and a second bank and the second cell comprising a third bank of transistors;

the bias circuit provides the bias signal to turn on the first bank and keep the first bank biased on during the operation; and the bias control circuit determines a control signal based on the detected voltage, and provides the control signal commonly for the second bank and the third bank to control the output current.

17. The power amplifier device as in claim 16, wherein:
at least one of the first, second and third banks includes two or more field effect transistors, and gates of the two or more transistors are connected to one another to receive a control gate voltage, drains of the two or more transistors are connected to one another at a common drain potential, and sources of the two or more transistors are connected to one another at a common source potential.

18. The power amplifier device as in claim 16, wherein:
at least one of the first, second and third banks includes two or more bipolar junction transistors, and bases of the two or more transistors are connected to one another to receive a control base current, collectors of the two or more transistors are connected to one another at a common collector potential, and emitters of the two or more transistors are connected to one another at a common emitter potential.

19. The power amplifier device as in claim 1, wherein
the plurality of cells include a first cell that comprises a transistor with two or more bias levels;
the bias circuit provides the bias signal to keep a lowest bias level during the operation; and
the bias control circuit determines the control signals based on the detected voltage, and provides the control signals for a second lowest bias level and above to control the output current.

20. A power amplifier device, comprising:
an input port that receives an RF signal to be amplified in power;
an output port to output the RF signal that is amplified in power;
a cell, including a first end coupled to the input port, a second end coupled to the output port and transistors that are segmented into a first bank and a second bank to amplify power of the RF signal;
a variable output matching network (OMN) coupled between the cell and the output port to direct the RF signal that is amplified in power to the output port;
a bias circuit that provides a bias signal to turn on the first bank and keep the first bank biased on during amplification of the RF signal;
an RF signal detector circuit that detects the RF signal to produce a detected voltage; and
a bias control circuit that receives the detected voltage, produces first and second control signals based on the detected voltage, and directs the first control signal to the second bank to control an output current to increase with an increase in the first control signal and the second control signal to the variable OMN,
wherein the cell, the RF signal detector circuit, the bias circuit, the OMN and the bias control circuit are configured to increase an output power associated with the output current to expand a linear region and increase efficiency at a power back-off.

21. The power amplifier device as in claim 20, wherein the RF signal detector circuit is coupled to the input port to detect the RF signal associated with an input power.

22. The power amplifier device as in claim 20, wherein the RF signal detector circuit is coupled to the output port to detect the RF signal associated with the output power.

23. A power amplifier device for receiving an RF signal associated with an input power at an input port, amplifying the RF signal to an output power with a higher power level, and presenting the RF signal that is amplified and associated with the output power at an output port, the power amplifier device comprising:
a plurality of cells, each of which has a first end coupled to the input port and a second end coupled to the output port and comprises at least one bank of transistors;
a plurality of transmission lines connecting the plurality of cells, the output port, and the input port; and
a control circuit coupled to the cells to provide control signals respectively for the banks of transistors to vary the output power by individually switching on and off the banks of transistors.

24. The power amplifier as in claim 23, wherein at least one cell includes a plurality of transistors that are segmented into at least two banks of transistors.

25. The power amplifier as in claim 23, wherein at least a segment of the plurality of transmission lines comprises a Composite Right and Left Handed Metamaterial (CRLH MTM) structure.

26. The power amplifier as in claim 23, wherein the control circuit is configured to produce a common control signal as control signals for at least two banks of transistors.

27. A method of amplifying an RF signal associated with an input power to an output power with a higher power level to have the RF signal that is amplified and associated with the output power by using a power amplifier device comprising a plurality of cells, each of which has a first end coupled to an input port and a second end coupled to an output port and comprises one or more banks of transistors, the method comprising steps of:
applying a bias signal to turn on at least one bank of transistors in the plurality of cells and keep the at least one bank biased on during an operation;
detecting the RF signal;
converting the RF signal that is detected in the detecting step to a detected voltage;
producing control signals based on the detected voltage; and
applying the control signals respectively to the banks of transistors other than the at least one bank of transistors that is biased on, to control an output current to increase with an increase in the control signals to expand a linear region of the device and to increase efficiency of the device at a power back-off.

28. The method as in claim 27, wherein the RF signal in the detecting step is the RF signal associated with the input power.

29. The method as in claim 27, wherein the RF signal in the detecting step is the RF signal that is amplified and associated with the output power.

30. The method as in claim 27, wherein
the transistors are bipolar junction transistors;
the bias signal in the applying step is a bias base current for the at least one bank of transistors; and
the control signals are control base currents respectively for the banks of transistors other than the at least one bank of transistors.

31. The method as in claim 27, wherein
the transistors are field effect transistors;
the bias signal in the applying step is a bias gate voltage for the at least one bank of transistors; and
the control signals are control gate voltages respectively for the banks of transistors other than the at least one bank of transistors.

32. A method of amplifying an RF signal associated with an input power to an output power with a higher power level to have the RF signal that is amplified and associated with the output power by using a power amplifier device comprising a first cell and a second cell, each of which has a first end coupled to an input port and a second end coupled to an output port, the first cell comprising transistors segmented into a first bank of transistors and a second bank of transistors and the second cell comprising a third bank of transistors, the method comprising steps of:
- applying a bias signal to turn on the first bank and keep the first bank biased on during an operation of the device;
- detecting the RF signal;
- converting the RF signal, which is detected in the detecting step, to a detected voltage using a DC conversion;
- producing a control signal based on the detected voltage; and
- applying the control signal to the second bank and the third bank, to control an output current to increase with an increase in the control signal to expand a linear region and increase efficiency at a power back-off condition.

33. A power amplifier device that provides a variable amplification to an RF signal based on a Composite Right and Left Handed Metamaterial structure, comprising:
- an input port to receive an input RF signal to be amplified;
- an output port to output an output RF signal that is amplified by amplifying the input RF signal;
- a plurality of banks of one or more transistors that amplify RF signals and are coupled between the input port and the output port;
- a plurality of transmission lines coupled to connect the banks of one or more transistors, the input port and the output port, at least one of the transmission lines including a Composite Right and Left Handed Metamaterial (CRLH MTM) structure; and
- a control mechanism coupled to the banks of one or more transistors to selectively switch on or off one or more banks of one or more transistors and to control the one or more banks of one or more transistors that are switched on to vary a power level of the output RF signal and efficiency of the device.

34. The device as in claim 33, comprising:
- an RF signal detector circuit that detects one of the input RF signal and the output RF signal to produce a detected DC voltage,
- wherein the control mechanism receives the detected DC voltage to control, based on the detected DC voltage, bias of the one or more banks of one or more transistors that are switched in varying the power level of the output RF signal and the efficiency of the device, and
- wherein at least one bank of one or more transistors is turned on and biased at a bias voltage that is not controlled by the control mechanism based on the detected DC voltage.

35. The device as in claim 34, wherein the banks of one or more transistors and the transmission lines are structured to operate at two or more signal frequencies of the input RF signal and to produce the output RF signal at the two or more signal frequencies.

36. The device as in claim 35, wherein the output port comprises a plurality of frequency specific output ports for outputting signals at designated output frequencies, and
- wherein the device comprises switches coupled to the frequency specific output ports to direct RF signals at designated output frequencies to the frequency specific output ports, respectively.

37. The device as in claim 33, wherein the plurality of banks of one or more transistors include a first bank of one or more transistors, a second bank of one or more transistors and a third bank of one or more transistors,
- wherein the device includes a first cell that has the first and second banks of one or more transistors and is coupled between the input and output ports, a second cell that has the third bank of one or more transistors and is coupled between the input and output ports, and a bias circuit coupled to the first bank of one or more transistors to provide a bias signal to turn on the first bank and keep the first bank biased on during an operation of the device, and
- the control mechanism produces a common control signal based on a DC voltage associated with either the input RF signal or output RF signal and applies the common control signal to the second bank in the first cell and the third bank in the second cell to control biasing of the second and third banks to vary the power level of the output RF signal while increasing a linear operation range and efficiency of the device.

* * * * *